(12) United States Patent  
Yang et al.

(10) Patent No.: US 11,099,441 B2
(45) Date of Patent: *Aug. 24, 2021

(54) WIRE SUBSTRATE AND DISPLAY DEVICE INCLUDING THE SAME

(71) Applicant: Samsung Display Co., Ltd., Yongin-si (KR)

(72) Inventors: Chan Woo Yang, Siheung-si (KR); Hong Sick Park, Suwon-si (KR); Hyun Eok Shin, Gwacheon-si (KR); Joon Yong Park, Gunpo-si (KR); Gyung Min Baek, Yongin-si (KR); Sang Won Shin, Yongin-si (KR); Ju Hyun Lee, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 214 days.

This patent is subject to a terminal disclaimer.

(21) Appl. No.: 16/460,829

(22) Filed: Jul. 2, 2019

(65) Prior Publication Data

US 2019/0324337 A1     Oct. 24, 2019

Related U.S. Application Data

(62) Division of application No. 15/906,991, filed on Feb. 27, 2018, now Pat. No. 10,386,687.

(30) Foreign Application Priority Data

Sep. 15, 2017   (KR) .................. 10-2017-0118647

(51) Int. Cl.
*H01L 29/49* (2006.01)
*G02F 1/1362* (2006.01)
(Continued)

(52) U.S. Cl.
CPC ...... *G02F 1/136286* (2013.01); *G02F 1/1368* (2013.01); *G02F 1/133553* (2013.01);
(Continued)

(58) Field of Classification Search
CPC ......... G02F 1/136286; G02F 1/133553; G02F 1/136209; G02F 1/1368; H01L 27/124;
(Continued)

(56) References Cited

U.S. PATENT DOCUMENTS 10,386,687 B2 *  8/2019  Yang ................. H01L 21/32139
2017/0123565 A1    5/2017  Li
(Continued)

FOREIGN PATENT DOCUMENTS

| JP | 5542710 | 7/2014 |
|---|---|---|
| KR | 10-2011-0090408 | 8/2011 |
| KR | 10-2016-0056390 | 5/2016 |

*Primary Examiner* — Dung A. Le
(74) *Attorney, Agent, or Firm* — Lewis Roca Rothgerber Christie LLP

(57) ABSTRACT

A wire substrate, a display device including a wire substrate, and a method of fabricating a wire substrate are disclosed. The display device comprises: a first base; and a first wiring layer disposed on the first base and comprising a conductive layer and a metal oxide layer stacked on the conductive layer, wherein the metal oxide layer comprises molybdenum (Mo), tantalum (Ta), and oxygen (O). The conductive layer includes a first metal layer on the first base, and a second metal layer between the first metal layer and the metal oxide layer. The second metal layer has a higher electrical conductivity than the first metal layer, and a thickness of the second metal layer is greater than a thickness of the first metal layer.

14 Claims, 14 Drawing Sheets

(51) Int. Cl.
    *H01L 27/12*         (2006.01)
    *G02F 1/1335*      (2006.01)
    *H01L 21/285*      (2006.01)
    *G02F 1/1368*      (2006.01)
    *H01L 21/3213*     (2006.01)

(52) U.S. Cl.
    CPC .... *G02F 1/136209* (2013.01); *H01L 21/2855* (2013.01); *H01L 21/32134* (2013.01); *H01L 21/32139* (2013.01); *H01L 27/124* (2013.01); *H01L 27/1218* (2013.01); *H01L 27/1262* (2013.01); *H01L 29/4908* (2013.01); *H01L 29/4958* (2013.01); *G02F 1/13629* (2021.01); *G02F 1/136295* (2021.01); *G02F 2201/12* (2013.01); *G02F 2201/38* (2013.01); *G02F 2201/40* (2013.01)

(58) Field of Classification Search
    CPC ............. H01L 27/1218; H01L 27/1262; H01L 21/2855; H01L 21/32139
    See application file for complete search history.

(56) References Cited

U.S. PATENT DOCUMENTS

| | | |
|---|---|---|
| 2017/0170199 A1 | 6/2017 | Zhang |
| 2017/0330698 A1 | 11/2017 | Park et al. |
| 2018/0375057 A1 | 12/2018 | Shin et al. |
| 2019/0004616 A1 | 1/2019 | Baek et al. |

\* cited by examiner

FIG. 14

| experimental example 1 | experimental example 2 | experimental example 3 | experimental example 4 |
|---|---|---|---|
| T/A : 72<br>Skew : 1.1μm<br>Tip : 0.05μm<br>E/T : 171sec | T/A : 68<br>Skew : 1.72μm<br>Tip : 0.07μm<br>E/T : 194sec | T/A : 85<br>Skew : 2.21μm<br>Tip : 0.16μm<br>E/T : 295sec | T/A : 80<br>Skew : 1.46μm<br>Tip : 0.2μm<br>E/T : 171sec |

WIRE SUBSTRATE AND DISPLAY DEVICE INCLUDING THE SAME

CROSS-REFERENCE TO RELATED APPLICATION

This application is a divisional of U.S. patent application Ser. No. 15/906,991, filed Feb. 27, 2018, which claims priority to and the benefit of Korean Patent Application No. 10-2017-0118647, filed on Sep. 15, 2017, in the Korean Intellectual Property Office, the disclosure of which is incorporated herein in its entirety by reference.

BACKGROUND

1. Field

The present disclosure relates to a wire substrate, a display device including the same, and method of fabricating a wire substrate.

2. Description of the Related Art

Display devices become more and more important as multimedia technology evolves. Accordingly, a variety of display devices such as liquid-crystal display (LCD) devices and organic light-emitting diode display (OLED) devices are currently utilized.

A display device may include a plurality of pixels representing different colors to achieve color reproduction. In order to operate (i.e., control) the pixels of a display device individually and to have them to display different colors, the display device may include driving signal wires for transmitting driving signals and various functional electrodes arranged in each of the pixels.

For example, driving signal wires and the like should have low electric resistance, high thermal stability and easy processability.

SUMMARY

As resolution of display devices ever increases, the area occupied by a single pixel tends to decrease. In addition, as the degree of integration of the driving signal wires and the functional electrodes increases, it is not easy to achieve a sufficient aperture ratio. The aperture ratio is an important factor affecting the display quality, such as the brightness of the display device. In order to increase the aperture ratio of the display device, it may be contemplated to reduce the area occupied by the light-shielding member.

Unfortunately, if the area of the light-shielding member is reduced, wires and/or electrodes not covered by the light-shielding member may reflect external light. The external light reflected by the wires or the like may cause deterioration of the display quality, such as lowering the contrast of the display device.

In view of the above, aspects of the present disclosure are directed toward a display device with improved aperture ratio as well as improved resolution and display quality by way of suppressing reflection of external light.

Aspects of the present disclosure are also directed toward a wire substrate for display devices capable of improving resolution and display quality.

Aspects of the present disclosure are also directed toward a method of fabricating a wire substrate for display devices by which resolution and display quality can be improved while defective etching can be reduced or prevented.

These and other aspects, embodiments and enhancements of the present disclosure will become apparent (e.g., immediately apparent) from the Detailed Description and Claims to follow, or may be learned by practice of the presented embodiments.

According to an exemplary embodiment of the invention, a display device includes: a first base; and a first wiring layer on the first base, the first wiring layer including a conductive metal layer and a metal oxide layer stacked on one another, wherein the metal oxide layer includes $Mo_xTa_yO_z$, wherein a content of tantalum is equal to or less than 2.0 at % (atomic percent) based on a total number of metal atoms (i.e., total number of metal atoms included in $Mo_xTa_yO_z$).

In an exemplary embodiment, the conductive metal layer may be opaque and includes a plurality of layers, and wherein a light reflectivity of the metal oxide layer may be smaller than a light reflectivity of a top layer of the conductive metal layer in contact with the metal oxide layer.

In an exemplary embodiment, the conductive metal layer may be between the first base and the metal oxide layer, and wherein the metal oxide layer may be a top layer of the first wiring layer.

In an exemplary embodiment, the conductive metal layer may be between the first base and the metal oxide layer, and wherein a reflectivity of the first wiring layer with respect to light that may have a wavelength of 550 nm and may be incident in a direction from an upper side to a lower side is equal to or less than 6.0%.

In an exemplary embodiment, the conductive metal layer may include a first metal layer on the first base, and a second metal layer between the first metal layer and the metal oxide layer, wherein the second metal layer may have a higher electrical conductivity than the first metal layer.

In an exemplary embodiment, a thickness of the second metal layer may be greater than a thickness of the first metal layer.

In an exemplary embodiment, the first metal layer may include a refractory metal, and wherein the second metal layer may include copper, silver, aluminum, or an alloy thereof.

In an exemplary embodiment, the conductive metal layer may include a first metal layer on the first base, and a second metal layer between the first metal layer and the metal oxide layer, the second metal layer in contact with the first metal layer and the metal oxide layer, wherein a thickness of the metal oxide layer may be greater than a thickness of the first metal layer and may be less than a thickness of the second metal layer, and wherein the thickness of the metal oxide layer may range from 300 to 550 Å.

In an exemplary embodiment, the conductive metal layer may include a first metal layer on the first base, and a second metal layer between the first metal layer and the metal oxide layer, the second metal layer in contact with the first metal layer, wherein a width of a surface of the first metal layer facing the second metal layer may be greater than a width of a surface of the second metal layer facing the first metal layer.

In an exemplary embodiment, a side wall of the metal oxide layer may protrude from a side wall of the conductive metal layer to form a tip.

In an exemplary embodiment, the display device may further include: a second wiring layer partially overlapping with the first wiring layer and insulated from the first wiring layer, the second wiring layer including a conductive metal layer and a metal oxide layer stacked on one another, wherein the metal oxide layer of the second wiring layer may include $Mo_xTa_yO_z$, wherein a content of tantalum is equal to or less than 2.0 at % based on a total number of metal atoms (i.e., total number of metal atoms included in $Mo_xTa_yO_z$).

In an exemplary embodiment, the display device may further include: a semiconductor material layer between the first and second wiring layers, wherein the first base may be a glass substrate, and wherein the conductive metal layer of the first wiring layer may be directly on the first base.

In an exemplary embodiment, the first wiring layer may include a gate signal wire extending in a first direction and a sustaining electrode, and wherein the second wiring layer may include a data signal wire extending in a second direction intersecting with the first direction.

In an exemplary embodiment, the conductive metal layer of the second wiring layer may include a third metal layer and a fourth metal layer between the third metal layer and the metal oxide layer, wherein a thickness of the first metal layer may be greater than a thickness of the third metal layer, and wherein a thickness of the second metal layer may be greater than a thickness of the fourth metal layer.

In an exemplary embodiment, a side wall of the metal oxide layer may protrude from a side wall of the conductive metal layer to form a tip in each of the first wiring layer and the second wiring layer, and wherein a length of the tip of the metal oxide layer in the second wiring layer may be greater than a length of the tip of the metal oxide layer of the first wiring layer.

In an exemplary embodiment, the display device may further include: a light-shielding member on the second wiring layer and having a line shape extended in the first direction, wherein the sustaining electrode may include a portion extended in the first direction and a portion extended in the second direction, wherein the gate signal wire may completely overlap with the light-shielding member, wherein the sustaining electrode may partially overlap with the light-shielding member, wherein at least a part of the portion extended in the second direction may not overlap the light-shielding member, and wherein the data signal wire may partially overlap with the light-shielding member, wherein at least a part of the data signal wire may not overlap with the light-shielding member.

According to an exemplary embodiment of the invention, a wire substrate include: a base; a conductive metal layer on the base; and a metal oxide layer on the conductive metal layer, wherein the metal oxide layer includes $Mo_xTa_yO_z$, wherein a content of tantalum is equal to or less than 2.0 at % based on a total number of metal atoms.

According to an exemplary embodiment of the invention, a method of fabricating a wire substrate includes: forming a conductive metal layer on a base; forming a metal oxide layer on the conductive metal layer; forming a mask pattern on the metal oxide layer; and etching the conductive metal layer and the metal oxide layer altogether to form a wire, wherein the metal oxide layer includes $Mo_xTa_yO_z$, wherein a content of tantalum is equal to or less than 2.0 at % based on a total number of metal atoms.

In an exemplary embodiment, the forming the metal oxide layer may include forming the metal oxide layer by sputtering, wherein the sputtering may be carried out under an inert gas atmosphere, and wherein a target of the sputtering may include $Mo_xTa_yO_z$, wherein a content of tantalum may be equal to or less than 2.0 at % based on a total number of metal atoms.

In an exemplary embodiment, the etching may include carrying out wet etching utilizing an etchant, wherein the etchant may include a peroxysulfate of 10.0 to 20.0% by weight, an organic acid of 0.1 to 5.0% by weight, a fluorine-containing compound of 0.1 to 1.5% by weight, and a cyclic amine compound of 0.01 to 2.0% by weight, with the rest being water.

According to an exemplary embodiment of the present disclosure, a wiring layer includes $Mo_xTa_yO_z$ having a very low reflectivity with respect to the visible wavelength band, so that it is possible to suppress deterioration of display quality due to reflection of external light.

In addition, the wiring layer itself has a very low reflectivity, such that the planar area occupied by the light-shielding member can be reduced, the aperture ratio of the display device can be improved, and the resolution of the display device can be further increased.

According to an exemplary embodiment of the present disclosure, a method of fabricating a wire substrate and a wire substrate can provide a display device having improved resolution and display quality.

It should be noted that effects of the present disclosure are not limited to those described above and other effects of the present disclosure will be apparent to those skilled in the art from the following descriptions.

BRIEF DESCRIPTION OF THE DRAWINGS

The above and other aspects and features of the present disclosure will become more apparent by describing in more detail exemplary embodiments thereof with reference to the accompanying drawings, in which:

FIG. 14 shows microscopic images of the stack patterns formed according to Experimental Examples 1 to 4;

DETAILED DESCRIPTION

Figure 1:
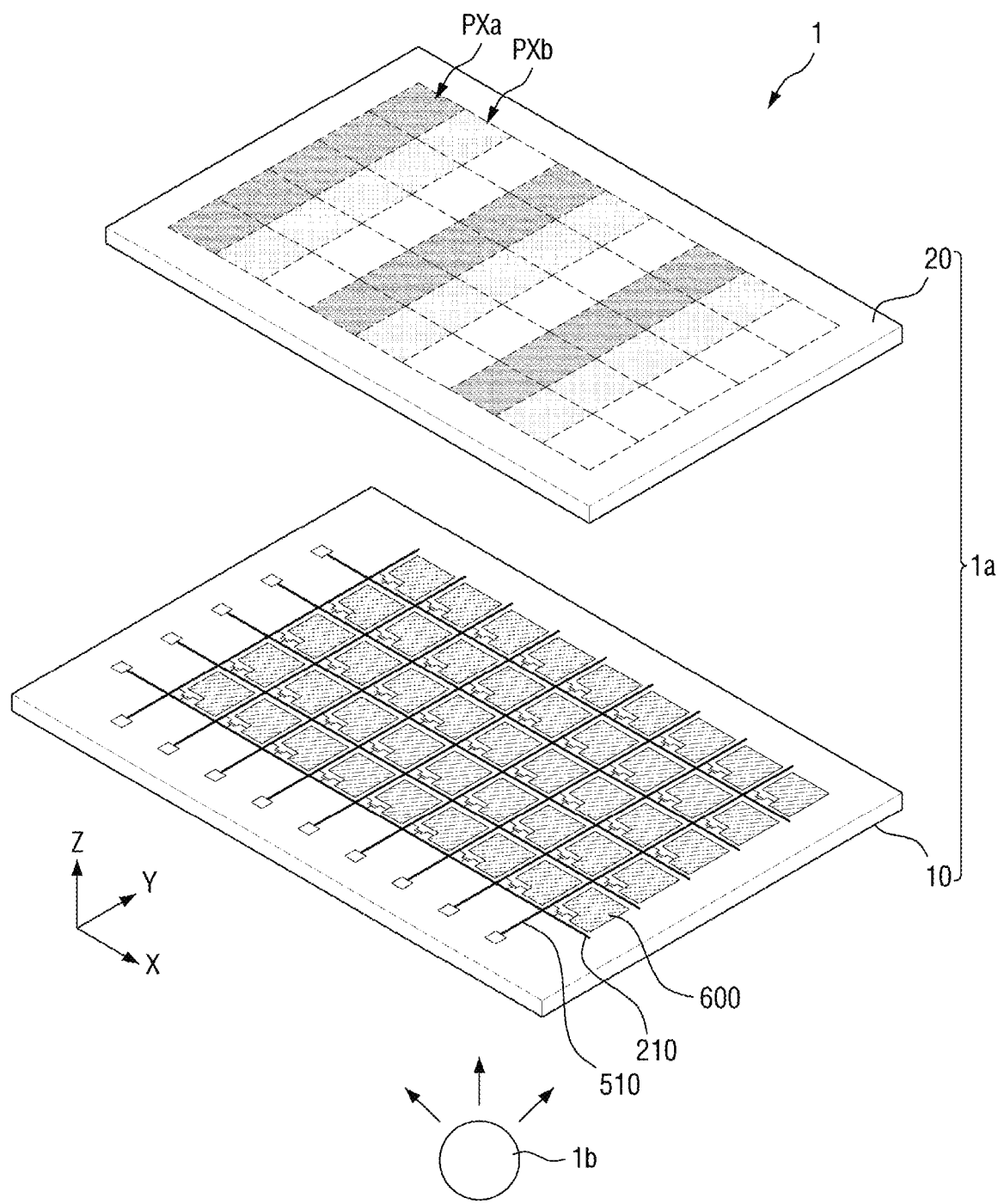
FIG. 1 is an exploded, perspective view of a display device according to an exemplary embodiment of the present disclosure.

Features of the invention and methods of accomplishing the same may be understood more readily by reference to the following detailed description of preferred embodiments and the accompanying drawings. The invention may, however, be embodied in many different forms and should not be construed as being limited to the embodiments set forth herein. Rather, these embodiments are provided so that this disclosure will be thorough and complete and will fully convey the concept of the invention to those skilled in the art, and the invention will only be defined by the appended claims, and equivalents thereof.

It will be understood that when an element or layer is referred to as being "on," "connected to" or "coupled to" another element or layer, the element or layer can be directly on, connected to or coupled to another element or layer or intervening elements or layers may exist. In contrast, when an element is referred to as being "directly on," "directly connected to" or "directly coupled to" another element or layer, there are no intervening elements or layers present. As used herein, the term "connected" may refer to elements being physically, electrically and/or fluidly connected to each other.

Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Spatially relative terms, such as "below," "lower," "under," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" relative to other elements or features would then be oriented "above" relative to the other elements or features. Thus, the exemplary term "below" can encompass both an orientation of above and below. The device may be otherwise oriented (rotated 90 degrees or at other orientations) and the spatially relative descriptors used herein should be interpreted accordingly.

The terminology used herein is for the purpose of describing particular embodiments only and is not intended to be limiting. As used herein, the singular forms "a," "an" and "the" are intended to include the plural forms as well, including "at least one," unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof. The term "at least one" is not to be construed as limiting "a" or "an." The term "or" has the same meaning as the term "and/or." As used herein, the term "and/or" includes any and all combinations of one or more of the associated listed items.

In the present specification, a first direction X is any direction in a plane, a second direction Y is a direction intersecting the first direction X in the plane, and a third direction Z is a direction perpendicular to the plane.

Hereinafter, exemplary embodiments of the present disclosure will be described with reference to the accompanying drawings.

FIG. 1 is an exploded, perspective view of a display device according to an exemplary embodiment of the present disclosure.

Referring to FIG. 1, a display device 1 according to an exemplary embodiment of the present disclosure includes a display panel 1a and a light source unit 1b for providing light to the display panel 1a.

A plurality of pixels PXa and PXb may be defined on the display panel 1a such that the pixels PXa and PXb are extended in a first direction X and a second direction Y to form a matrix when viewed from the top. As used herein, a "pixel" refers to a single area defined by dividing a display area into sub-areas for color reproduction when viewed from the top. A single pixel may represent a predetermined or set one of primary colors. That is, a (e.g., one) pixel may be a minimum unit of the display panel 1a that can represent a color different from that of another pixel. The primary colors may include, but is not limited to, red, green and blue. As a non-limiting example, the first pixels PXa and the second pixels PXb arranged in the first direction X may represent different colors.

The display panel 1a may include driving signal wires such as a plurality of gate signal wires 210 extending in the first direction X, and a plurality of data signal wires 510 extending in the second direction Y and insulated from the gate signal wires 210. The gate signal wires 210 and the data signal wires 510 may be connected to drivers to transmit the driving signals to the pixel electrode 600 disposed in each of the plurality of pixels.

The light source unit 1b may be disposed below the display panel 1a to provide light having a specific wavelength to the display panel 1a. The light source unit 1b may include light sources that emit light, and a light guide plate that guides the path of light provided from the light sources so that light exits toward the display panel 1a. The material of the light guide plate is not particularly limited as long as it has high light transmittance. For example, it may be made of a glass material, a quartz material, or a plastic material such as polyethylene terephthalate, polycarbonate, etc.

The light sources may be light-emitting diodes (LEDs), organic light-emitting diodes (OLEDs), or the like. In an exemplary embodiment, the light sources may emit light in the blue wavelength band or may emit light of white color.

Although not shown in the drawings, one or more optical sheets may be disposed between the display panel 1a and the light source unit 1b. The optical sheets may include one or more of a prism sheet, a diffusion sheet, a (reflective) polarizing sheet, a lenticular lens sheet, and a micro lens sheet. The optical sheets can improve the display quality of the display device 1 by modulating optical characteristics of light provided from the light source unit 1b and traveling toward the display panel 1a. For example, the optical sheets may condense light, diffuse/scatter light, or modulate polarization characteristics of the light.

Hereinafter, the display panel 1a according to the exemplary embodiment of the present disclosure will be described in more detail with reference to FIGS. 2 and 3.

Figure 2:
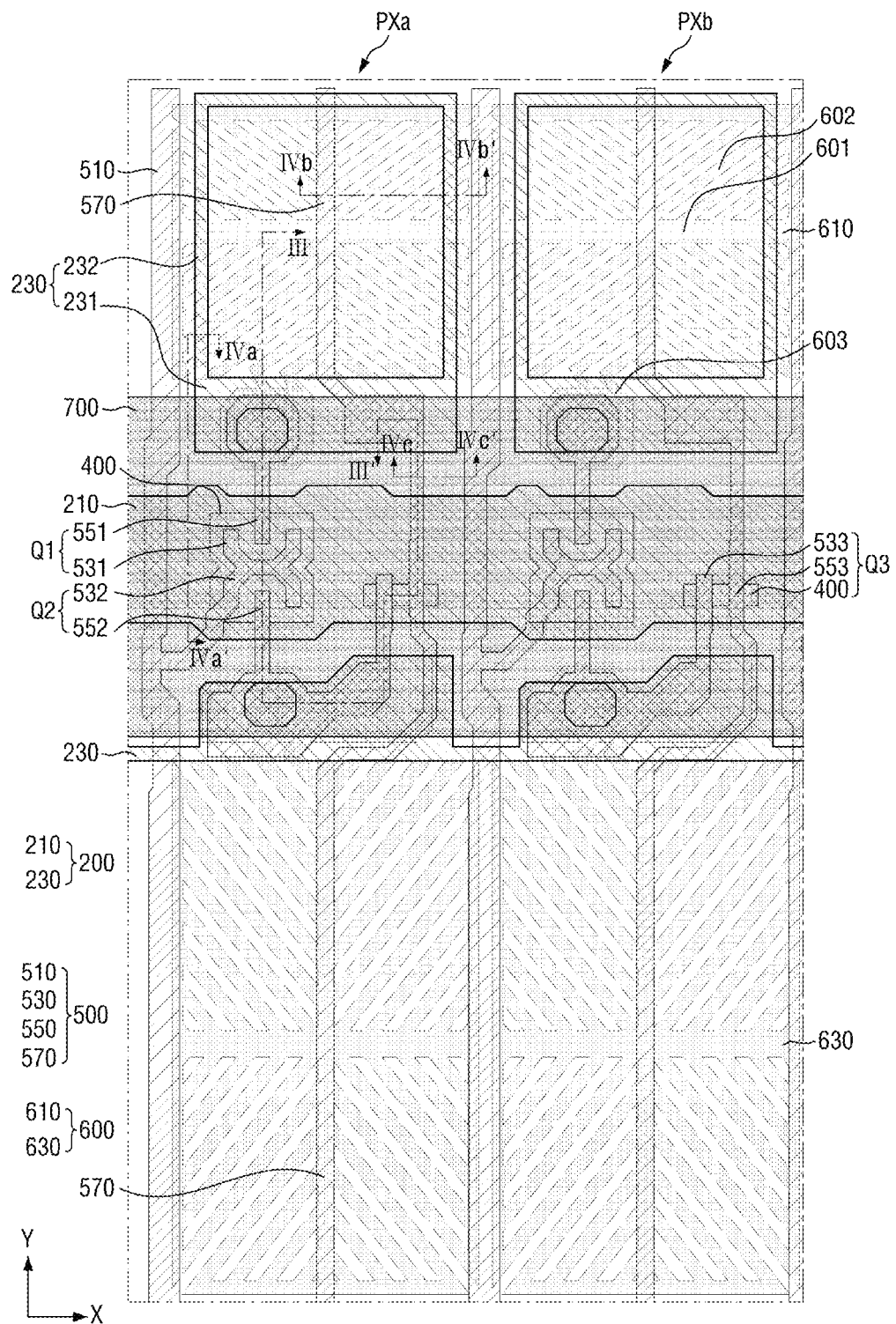
FIG. 2 is a layout diagram of some pixels of the display device shown in FIG. 1.

FIG. 2 is a layout diagram of some pixels of the display device shown in FIG. 1, which shows a first wiring layer 200, a second wiring layer 500, a pixel electrode 600, a light-shielding member 700, and the like. FIG. 3 is a cross-sectional view taken along the line III-III' of FIG. 2.

Figure 3:
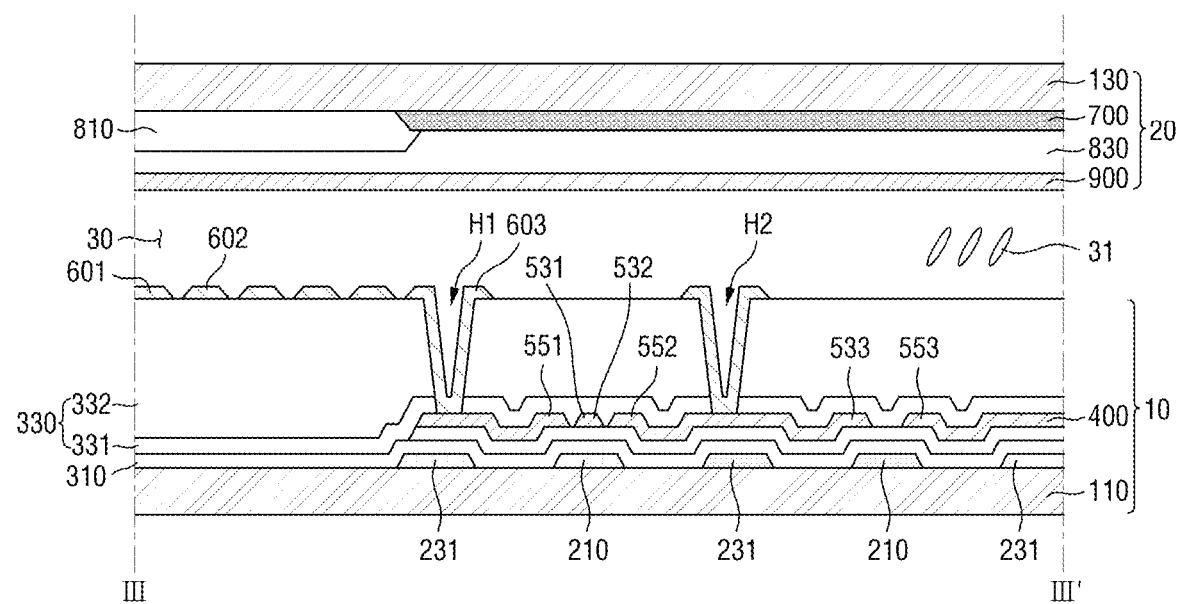
FIG. 3 is a cross-sectional view taken along the line III-III' of FIG. 2.

Referring to FIGS. 1 to 3, the display panel 1a according to the exemplary embodiment of the present disclosure may include a lower substrate 10 and an upper substrate 20 facing each other, and a liquid-crystal layer 30 interposed therebetween. The liquid-crystal layer 30 may be sealed by the lower substrate 10, the upper substrate 20 and a sealing member for attaching them together. The lower substrate 10 may be a wire substrate on which driving signal wires for driving the display panel 1a are arranged. The upper substrate 20 may be a color conversion substrate on which a color conversion pattern is arranged.

The lower substrate 10 will be described first. The lower substrate 10 may include a first base 110, a first wiring layer 200 disposed on the first base 110, a second wiring layer 500 disposed on the first wiring layer 200, and a pixel electrode 600 disposed on the second wiring layer 500.

The first base 110 may be a transparent insulating substrate. For example, the first base 110 may be a substrate made of a glass material, a quartz material, or a transparent plastic material. In some exemplary embodiment of the present disclosure, the first base 110 may be flexible such that the display device 1 may be a curved display device.

The first wiring layer 200 may be disposed on the first base 110. The first wiring layer 200 may be disposed directly on the first base 110. In an exemplary embodiment, the first wiring layer 200 may include gate signal wires 210 and sustaining electrodes 230. The gate signal wires 210 and the sustaining electrodes 230 may be disposed on the same layer. For example, the gate signal wires 210 and the sustaining electrodes 230 may have substantially the same structure and may be made of substantially the same material. They may be formed simultaneously or concurrently via a single process.

The gate signal wires 210 may extend generally in the first direction X. The gate signal wire 210 may deliver a gate driving signal provided from a gate driver to switching elements disposed in each of the pixels, such as PXa and PXb. For example, the plurality of pixels arranged in the first direction X may share one gate signal wire 210. It is, however, to be noted that this is merely illustrative.

A part of the gate signal wire 210 may form the gate electrode of the switching element. For example, a part of the gate signal wire 210 may serve as a control terminal of a first switching element Q1, a second switching element Q2 and a third switching element Q3, which will be described in more detail later. In another exemplary embodiment, the control terminal of the switching element may be formed such that it protrudes from the gate signal wire 210.

The sustaining electrode 230 may be arranged such that it overlaps with a part of the second wiring layer 500 and/or a part of the pixel electrode 600, which will be described in more detail later. The sustaining electrode 230 may form a holding capacitor along with the second wiring layer 500, the pixel electrode 600 and a plurality of dielectric layers disposed therebetween, which are disposed above the sustaining electrode 230. The holding capacitor can hold the voltage applied to the pixel electrode 600 during one frame. The sustaining electrode 230 may have an extended part in order to increase the overlapping area with the second wiring layer 500 and the pixel electrode 600. By doing so, the capacity of the holding capacitor can be increased, and the voltage can be stably maintained during one frame.

In an exemplary embodiment, the sustaining electrode 230 may be disposed such that it partially overlaps with the edge of a first sub-pixel electrode 610. When the first sub-pixel electrode 610 has a generally rectangular shape, the sustaining electrode 230 may have a substantially rectangular band shape including portions 231 extending in the first direction X and portions 232 extending in the second direction Y. However, this is merely illustrative and the sustaining electrode 230 may be modified in various suitable ways to form the holding capacitor along with the second wiring layer 500 and the pixel electrode 600.

The first wiring layer 200 including the gate signal wire 210 and the sustaining electrode 230 may have a stack structure including a conductive metal layer and a metal oxide layer stacked on each other. The stack structure of the first wiring layer 200 will be described later in more detail with reference to FIGS. 4 and 5.

A first insulating layer 310 may be disposed on the entire surface of the first base 110 over the first wiring layer 200. The first insulating layer 310 may include an insulative material so that it insulates elements thereon from elements thereunder. The first insulating layer 310 may be a gate insulating layer that insulates a control terminal (that is, a gate terminal) from a channel layer (i.e., active layer) of the first to third switching elements Q1 to Q3, which will be described in more detail later. The first insulating layer 310 may include silicon nitride, silicon oxide, silicon oxynitride, etc.

An active layer 400 may be disposed on the first insulating layer 310. The active layer 400 may include a semiconductor material. For example, the active layer 400 may include amorphous silicon or polycrystalline silicon, or may be made of an oxide semiconductor. A part of the active layer 400 may form a channel layer of the switching element. For example, a part of the active layer 400 may serve as a channel of the first switching element Q1, the second switching element Q2 and the third switching element Q3, which will be described in more detail later, such that it may turn on/off the channel depending on the voltage applied to the gate signal wire 210. In an exemplary embodiment, at least a part of the active layer 400 may extend generally in the second direction Y and may be disposed to overlap with the data signal wire 510.

The second wiring layer 500 may be disposed on the active layer 400. In an exemplary embodiment, the second wiring layer 500 may include a data signal wire 510, a source electrode layer 530 and a drain electrode layer 550, and may further include a reference voltage wire 570. The data signal wire 510, the source electrode layer 530, the drain electrode layer 550 and the reference voltage wire 570 may be disposed on the same layer. For example, the data signal wire 510, the source electrode layer 530, the drain electrode layer 550 and the reference voltage wire 570 may have substantially the same structure and may be made of substantially the same material. They may be formed simultaneously or concurrently via a single process.

The data signal wire 510 may extend generally in the second direction Y. The data signal wire 510 may deliver a data driving signal provided from a data driver to the switching elements disposed in each of the pixels PXa and PXb. For example, the plurality of pixels arranged in the second direction Y may share one data signal wire 510. It is, however, to be noted that this is merely illustrative.

The source electrode layer 530 may include a first source electrode 531, a second source electrode 532, and a third source electrode 533. The first source electrode 531, the second source electrode 532 and the third source electrode 533 may serve as input terminals of the first switching element Q1, the second switching element Q2 and the third switching element Q3, respectively.

The first source electrode 531 may protrude from the data signal wire 510 without physical boundary with the data signal wire 510. The first source electrode 531 may be spaced apart from the first drain electrode 551 above the gate signal wire 210 and the active layer 400.

The second source electrode 532 may protrude from the data signal wire 510 without physical boundary with the data signal wire 510 and the first source electrode 531. The second source electrode 532 may be spaced apart from the second drain electrode 552 above the gate signal wire 210 and the active layer 400.

The third source electrode 533 may be extended from the second drain electrode 552 without physical boundary with the second drain electrode 552. The third source electrode 533 may be spaced apart from the third drain electrode 553 above the gate signal wire 210 and the active layer 400.

The drain electrode layer 550 may include a first drain electrode 551, a second drain electrode 552, and a third drain electrode 553. The first drain electrode 551, the second drain electrode 552 and the third drain electrode 553 may serve as output terminals of the first switching element Q1, the second switching element Q2 and the third switching element Q3, respectively.

The first drain electrode 551 may be spaced apart from the first source electrode 531 above the gate signal wire 210 and the active layer 400. The first drain electrode 551 may be electrically connected to the first sub-pixel electrode 610 via the first contact hole H1.

The second drain electrode 552 may be spaced apart from the second source electrode 532 above the gate signal wire 210 and the active layer 400. The second drain electrode 552 may be electrically connected to the second sub-pixel electrode 630 via the second contact hole H2. In addition, the second drain electrode 552 and the third source electrode 553 may be formed as a single piece without physical boundary therebetween.

The third drain electrode 553 may be spaced apart from the third source electrode 533 above the gate signal wire 210 and the active layer 400.

The reference voltage wire 570 may extend generally in the second direction Y. For example, the part of the reference voltage wire 570 extended in the second direction Y may overlap with a stem 601 of the pixel electrode 600, which will be described later. As the reference voltage wire 570 overlaps with the stem 601 of the pixel electrode 600, it is possible to suppress the luminance degradation due to the reference voltage wire 570 penetrating through an opening. The reference voltage wire 570 may be applied with a reference voltage. The reference voltage will be described later along with the pixel electrode 600.

In an exemplary embodiment, a part of the reference voltage wire 570 may partially form the third drain electrode 553. For example, the reference voltage wire 570 to which the reference voltage is applied may also serve as an output terminal of the third switching element Q3. However, this is merely illustrative. In other exemplary embodiments, the reference voltage wire 570 may be physically separated from but electrically connected to the third drain electrode 553.

The second wiring layer 500 such as the data signal wire 510, the source electrode layer 530, the drain electrode layer 550 and the reference voltage wire 570 may have a stack structure including a conductive metal layer and a metal oxide layer stacked on each other. The stack structure of the second wiring layer 500 will be described later in more detail with reference to FIGS. 4 and 5.

A second insulating layer 330 may be disposed on the entire surface of the first base 110 over the second wiring layer 500. The second insulating layer 330 may be made of an insulative material. The second insulating layer 330 may insulate the second wiring layer 500 from the pixel electrode 600. The second insulating layer 330 may have a structure of a plurality of layers stacked on one another. For example, the second insulating layer 330 may have a double-layer structure including a protective layer 331 made of an inorganic material and a planarization layer 332 made of an organic material. In addition, a plurality of contact holes may be formed in the second insulating layer 330. For example, a first contact hole H1 may be formed by penetrating the second insulating layer 330 to partially expose the first drain electrode 551, and a second contact hole H2 may be formed by penetrating the second insulating layer 330 to partially expose the second drain electrode 552.

The pixel electrode 600 may be disposed on the second insulating layer 330. The pixel electrode 600 may form an electric field in the liquid-crystal layer 30 together with a common electrode 900 to be described later, to control the alignment of the liquid crystals (e.g., liquid crystal molecules) 31 in the pixel. The pixel electrode 600 may be disposed in each of the pixels and may receive voltage individually. The pixel electrode 600 may be a transparent electrode made of a transparent conductive material. Examples of the material for forming the transparent electrode may include indium tin oxide (ITO) or indium zinc oxide (IZO).

In an exemplary embodiment, the pixel electrode 600 in one pixel may include a first sub-pixel electrode 610 and a second sub-pixel electrode 630 spaced from each other. The area occupied by the first sub-pixel electrode 610 may be smaller than the area occupied by the second sub-pixel electrode 630 when viewed from the top.

The first sub-pixel electrode 610 and the second sub-pixel electrode 630 may have a generally rectangular shape when viewed from the top and may be pattern electrodes having divided domains (e.g., domain dividing means). For example, each of the first sub-pixel electrode 610 and the second sub-pixel electrode 630 may include a stem 601, a plurality of branches 602 extending from the stem 601, and a connecting portion 603 extended from branches 602.

The stem 601 may be formed in a generally cross shape. The stem 601 may overlap with the reference voltage wire 570 extended generally in the second direction Y. The branches 602 may be extended radially from the cross-like stem 601 with an inclination, for example, approximately 45 degrees. For example, each of the first sub-pixel electrode 610 and the second sub-pixel electrode 630 may have four domains that are divided by the stem 601 and each have branches extended in different directions. By doing so, the liquid crystals can be controlled more efficiently, the viewing angle can be improved, and the brightness and response time of the display device 1 can be improved.

The connecting portion 603 of the first sub-pixel electrode 610 may electrically connect the first sub-pixel electrode 610 with the first drain electrode 551 via the first contact hole H1. The connecting portion 603 of the second sub-pixel electrode 630 may electrically connect the second sub-pixel electrode 630 with the second drain electrode 552 via the second contact hole H2.

As described above, the first switching element Q1 to the third switching element Q3 may share a single gate signal wire 210 and may be controlled simultaneously. The data voltage supplied from the data signal wire 510 may be applied to the first sub-pixel electrode 610 via the first switching element Q1. On the other hand, the second drain electrode 552 of the second switching element Q2 may be electrically connected to the reference voltage wire 570 via the third switching element Q3. Therefore, a set or predetermined voltage having a level between the level of the data voltage provided from the data signal wire 510 and the level of the reference voltage provided from the reference voltage wire 570 may be applied to the second sub-pixel electrode 630. By doing so, the voltage applied to the second sub-pixel electrode 630 may be smaller than the voltage applied to the first sub-pixel electrode 610. By applying different voltages to the first sub-pixel electrode 610 and the second sub-pixel electrode 630 disposed in one pixel, it is possible to improve the side visibility of the display device 1.

Although FIG. 2 depicts that the edge of the first sub-pixel electrode 610 overlaps with the sustaining electrode 230, in other exemplary embodiments, the edge of the second sub-pixel electrode 630 may overlap with the sustaining electrode 230, or both of the first sub-pixel electrode 610 and the second sub-pixel electrode 630 may overlap with the sustaining electrode 230.

Next, the upper substrate 20 will be described in more detail. The upper substrate 20 may include a second base 130, a light-shielding member 700 disposed on a surface (lower surface in the drawing) of the second base 130 facing the first base 110, a color conversion pattern 810 disposed on the light-shielding member 700, and a common electrode 900 disposed on the color conversion pattern 810.

The second base 130 may be a transparent substrate like the first base 110. The first base 110 and the second base 130 may be made of either the same material or different materials.

The light-shielding member 700 may be disposed on the second base 130. The light-shielding member 700 may be made of a material that can block transmission of light in the visible wavelength band. The light-shielding member 700 may be disposed to overlap with the first switching element Q1, the second switching element Q2 and the third switching element Q3, thereby preventing or reducing unintended light leakage.

In an exemplary embodiment, the light-shielding member 700 may have a line shape (e.g., a narrow strip) extending in the first direction X and may overlap with the first to third switching elements Q1 to Q3. The light-shielding member 700 may or may not overlap with a part of the sustaining electrode 230, a part of the active layer 400 and a part of the data signal wire 510. Further, the light-shielding member 700 may completely overlap with the gate signal wire 210. In other words, the gate signal wire 210 may be completely covered by the light-shielding member 700. Although FIG. 2 (and the like) depicts an example where the light-shielding member 700 is disposed on the upper substrate 20, in other embodiments, the light-shielding member 700 may be disposed on the lower substrate 10.

The color conversion pattern 810 may be disposed on the light-shielding member 700 so as to overlap with the pixel electrode 600. The color conversion pattern 810 may be disposed at each of the pixels PXa and PXb. Light may have a specific wavelength band after it has passed through the color conversion pattern 810. Accordingly, different pixels PXa and PXb of the display device 1 may represent different colors.

For example, the color conversion pattern 810 may be a color filter containing a colorant material such as a dye or pigment. The colorant material may selectively absorb only a specific wavelength band of incident light. The color conversion pattern 810 may absorb light of a specific wavelength band of incident light and selectively transmit light of another specific wavelength band.

As another example, the color conversion pattern 810 may be a wavelength shifting member containing a wavelength shifting material such as a quantum dot material or a fluorescent material. The wavelength shifting material may convert or shift the peak wavelength of the incident light to another specific peak wavelength. The color conversion pattern 810 may absorb at least a part of the incident light to allow light having a specific peak wavelength to exit.

An overcoat layer 830 may be disposed on the entire surface of the second base 130 over the color conversion pattern 810. The overcoat layer 830 may provide a flat surface over a plurality of elements disposed on the second base 130, and the common electrode 900 may be disposed on the overcoat layer 830.

On the overcoat layer 830, the common electrode 900 may be disposed. The common electrode 900 may be a single piece formed across the pixels PXa and PXb such that a common voltage may be applied. The common electrode 900 may be a transparent electrode like the pixel electrode 600.

Next, the liquid-crystal layer 30 will be described in more detail. The liquid-crystal layer 30 may include liquid crystals (i.e., liquid crystal molecules) 31 that are initially orientated. The liquid crystals 31 may have a negative dielectric anisotropy and may be vertically aligned in the initial state. The liquid crystals 31 may have a predetermined pretilt angle in the initially aligned state. When an electric field is formed between the pixel electrode 600 and the common electrode 900, the liquid crystals 31 may be tilted in a specific direction to change the polarization state of light passing through the liquid-crystal layer 30. In another embodiment, the liquid crystals 31 may have a positive dielectric anisotropy and may be horizontally aligned in the initial state, and when the electric field is formed, the liquid crystals 31 may rotate to change the polarization state of the light.

Hereinafter, the first wiring layer 200 and the second wiring layer 500 according to the exemplary embodiment of the present disclosure will be described in more detail with reference to FIGS. 4 and 5.

Figure 4:
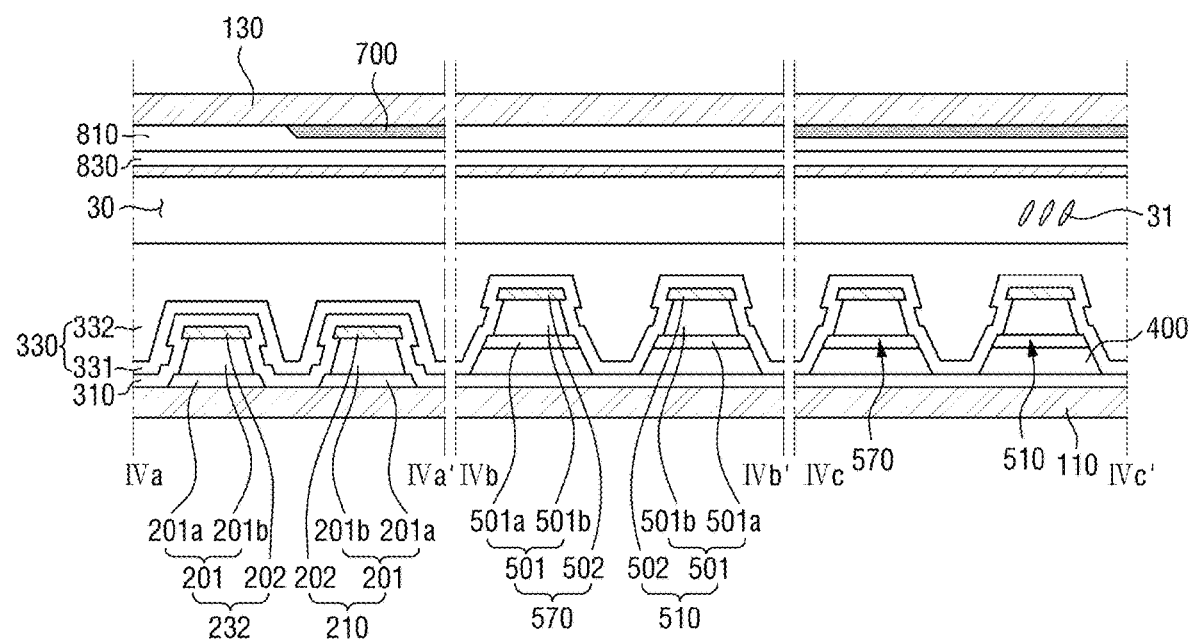
FIG. 4 is a cross-sectional view taken along the lines IVa-IVa', IVb-IVb' and IVc-IVc' of FIG. 2.
Figure 5:
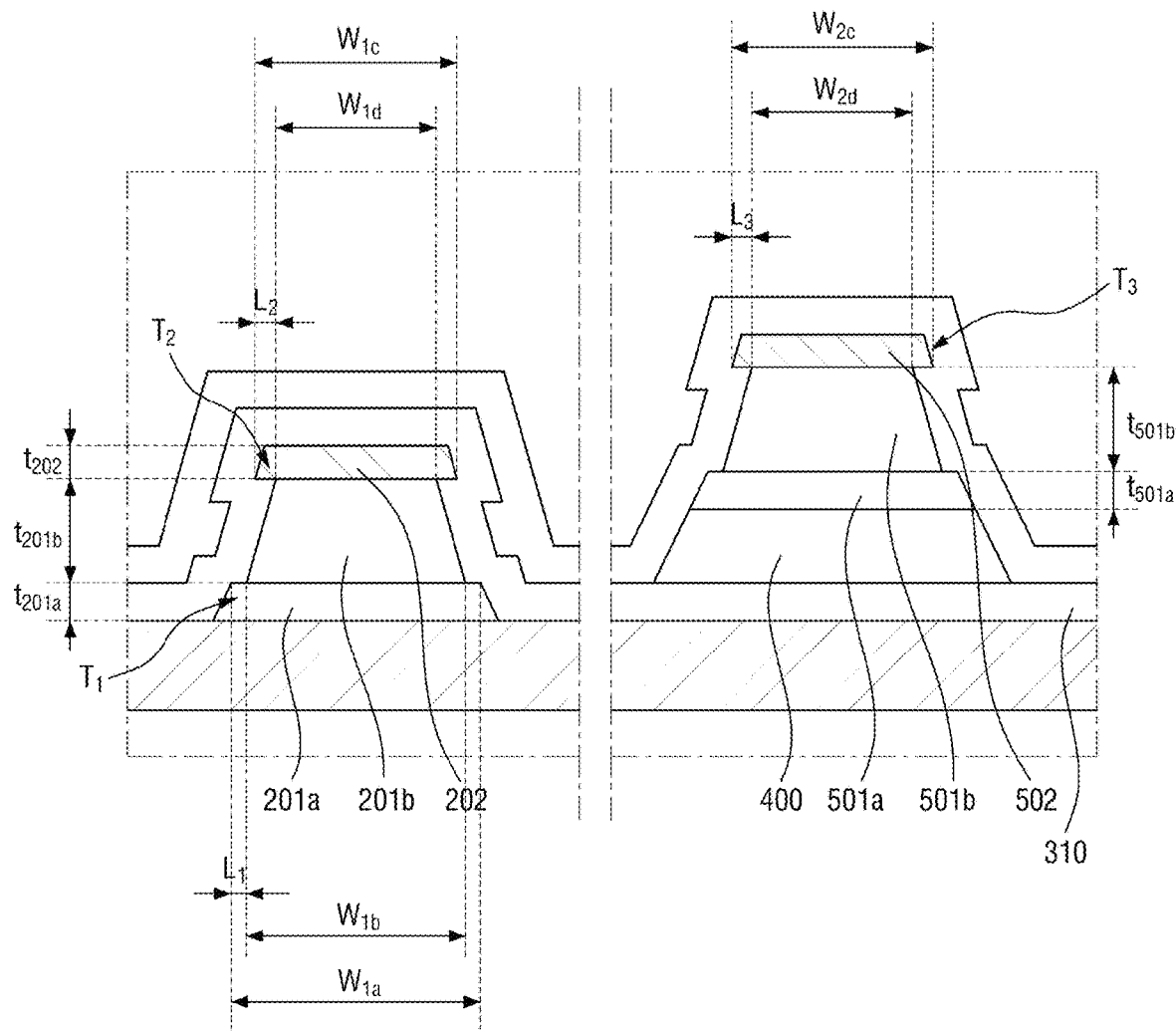
FIG. 5 is a cross-sectional view of a first wiring layer and a second wiring layer shown in FIG. 2.

FIG. 4 is a cross-sectional view taken along lines IVa-IVa', IVb-IVb' and IVc-IVc' of FIG. 2. Specifically, the cross-sectional view taken along the line IVa-IVa' shows the sustaining electrode 230 (e.g., the portion 232) and the gate signal wire 210. The cross-sectional view taken along the line IVb-IVb' shows the reference voltage wire 570 and the data signal wire 510 in the area where they do not overlap with the light-shielding member 700. The cross-sectional view taken along the line IVc-IVc' shows the reference voltage wire 570 and the data signal wire 510 in the area where they overlap with the light-shielding member 700. FIG. 5 is a cross-sectional view of the first wiring layer 200 and the second wiring layer 500 shown in FIG. 2.

Referring to FIGS. 1 to 5, each of the first wiring layer 200 and the second wiring layer 500 may have the conductive metal layers 201 and 501 and the metal oxide layers 202 and 502 stacked on one another, respectively, to form the stack structure. Although FIG. 4 (and the like) depicts both of the first wiring layer 200 and the second wiring layer 500 as including the conductive metal layers 201 and 501 and the metal oxide layers 202 and 502, respectively, one of the first wiring layer 200 and the second wiring layer 500 may not include the metal oxide layers 202 and 502.

First, the first wiring layer 200 will be described in more detail. The first wiring layer 200 may include a first conductive metal layer 201 disposed on the first base 110 and a first metal oxide layer 202 disposed on the first conductive metal layer 201.

The first conductive metal layer 201 may have a structure in which two or more layers are stacked on one another. For example, the first conductive metal layer 201 may include a first metal layer 201a and a second metal layer 201b stacked on each other.

The first metal layer 201a may include a metal material having an excellent adhesion to the first base 110 and may be disposed directly on the first base 110. For example, the first metal layer 201a may include a refractory metal having excellent processability. As used herein, the term "refractory metal" refers to a metal or an alloy having a melting point higher than 1500° C. Examples of the refractory metal may include niobium (Nb), vanadium (V), tantalum (Ta), titanium (Ti), zirconium (Zr), hafnium (Hf), molybdenum (Mo), rhenium (Re), tungsten (W), and the like. As a non-limiting example, the first metal layer 201a may be a titanium layer made solely of titanium or may be a single layer including an alloy. The first metal layer 201a may exhibit opaque properties.

The second metal layer 201b may be disposed directly on the first metal layer 201a. The second metal layer 201b may be the top layer of the first conductive metal layer 201 having the structure of a plurality of layers stacked on one another. The second metal layer 201b may include a metal material having a low specific resistance and an excellent electrical conductivity. The electrical conductivity of the second metal layer 201b may be greater than the electrical conductivity of the first metal layer 201a. For example, the second metal layer 201b may include copper (Cu), silver (Ag), aluminum (Al) or an alloy thereof. The second metal layer 201b may exhibit opaque properties. As a non-limiting example, the second metal layer 201b may be a copper layer made solely of copper or may be a single layer including an alloy.

As a non-limiting example, the first metal layer 201a may be made of a metal material having a refractive index higher than that of the second metal layer 201b. For example, the first metal layer 201a may have a refractive index of approximately 1.5 to 2.8 with respect to light in the visible wavelength band, and the second metal layer 201b may have a refractive index of approximately 0.20 to 1.2 with respect to light in the visible wavelength band. In one embodiment, the first metal layer 201a may have a refractive index of approximately 2.3 to 2.6, for example, approximately 2.5 with respect to light having the wavelength of 550 nm. The second metal layer 201b may have a refractive index of approximately 0.8 to 1.2, for example, approximately 1.0 with respect to light having the wavelength of 550 nm. It is, however, to be understood that this is merely illustrative.

The thickness $t_{201b}$ of the second metal layer 201b may be larger (i.e., greater) than the thickness $t_{201a}$ of the first metal layer 201a. For example, the thickness $t_{201a}$ of the first metal layer 201a may be approximately 50 to 500 Å, for example, approximately 100 to 300 Å. The thickness $t_{201b}$ of the second metal layer 201b may be approximately 1,000 to 20,000 Å, for example, approximately 5,000 to 10,000 Å.

In an exemplary embodiment, the sidewall of the first metal layer 201a may protrude from the sidewall of the second metal layer 201b to form a tip T1. The tip T1 of the first metal layer 201a can improve the stability of the second metal layer 201b. For example, the width $W_{1a}$ of the surface (upper surface in the drawing) of the first metal layer 201a facing the second metal layer 201b may be larger (i.e., greater) than the width $W_{1b}$ of the surface (lower surface in the drawing) of the second metal layer 201b facing the first metal layer 201a. The upper limit of the length L1 of the tip of the first metal layer 201a may be approximately 0.5 μm or less. If the length L1 of the tip is larger than 0.5 μm, there may arise a problem that the off-current of the switching element increases remarkably.

The first metal oxide layer 202 may be a single layer disposed directly on the second metal layer 201b. The first metal oxide layer 202 may include a material having a higher light absorptivity and a lower light reflectivity than the first conductive metal layer 201. The first metal oxide layer 202 may have a higher light absorptivity and a lower light reflectivity than (e.g., each of) the first metal layer 201a and the second metal layer 201b.

In an exemplary embodiment, the first metal oxide layer 202 may include $Mo_xTa_yO_z$. The content (i.e., the amount) of tantalum (Ta) among the metal atoms in the first metal oxide layer 202 may be equal to or less than approximately 2.0 at % (atomic percent), approximately 1.9 at %, approximately 1.8 at %, approximately 1.7 at %, approximately 1.6 at %, approximately 1.5 at %, approximately 1.4 at %, approximately 1.3 at %, approximately 1.2 at %, approximately 1.1 at % or approximately 1.0 at %. That is, the upper limit of the ratio of y to (x+y), i.e., (y/(x+y)) may be approximately 0.02. If the content of tantalum is greater than 2.0 at %, the light reflectivity of the first metal oxide layer 202 with respect to the visible wavelength band may increase. The reflectivity of the first metal oxide layer 202 may be the smallest when the content of tantalum lies between approximately 1.0 at % and 2.0 at %, although the present invention is not limited thereto. If the content of tantalum is larger (e.g., greater) than 2.0 at %, the etching stability may be lowered and thus it may be difficult to control the etched surface. For example, a tip T2 of the first metal oxide layer 202 described below may become too long.

The lower limit of the content of tantalum among the metal atoms in the first metal oxide layer 202 may be, but is not limited to, approximately 0.3 at % or more, or approximately 0.5 at % or more in light of the processability. Here, the lower limit of the ratio of y to (x+y), i.e., (y/(x+y)) may be approximately 0.003 or greater. If the content of tantalum is less than 0.3 at %, the metal oxide layer may be etched by water and thus may be unstable.

In some embodiment, a ratio of z to x, i.e., (z/x) may be approximately 2.0 to 3.0, or 2.2 to 2.3.

As a non-limiting example, the light absorptivity of the first metal oxide layer 202 having the thickness of 500 Å may be equal to or greater than approximately 40%, approximately 45%, approximately 50%, approximately 55%, or approximately 60%. For example, the first metal oxide layer 202 having the thickness of 500 Å itself may have, but is not limited to, a light reflectivity of approximately 25% to 40%, and a light transmittance of approximately 15% to 25%. For example, the extinction coefficient k of the first metal oxide layer 202 with respect to light in the visible wavelength band may range from approximately 0.40 to 0.90.

In addition, the refractive index of the first metal oxide layer 202 may be larger than that of the second metal layer 201b. For example, the refractive index of the first metal oxide layer 202 with respect to light in the visible wavelength band may be approximately 2.2 to 2.6. For example, the refractive index of the first metal oxide layer 202 with respect to light having the wavelength of 550 nm may be approximately 2.2 to 2.3.

The thickness $t_{202}$ of the first metal oxide layer 202 may be greater than the thickness $t_{201a}$ of the first metal layer 201a and less than the thickness $t_{201b}$ of the second metal layer 201b. In addition, the first metal oxide layer 202 may have a thickness of kλ/4, where k is an odd number, such that it can exhibit destructive interference with respect to light in the visible wavelength band. For example, the thickness $t_{202}$ of the first metal oxide layer 202 may be approximately 100 to 2,000 Å, approximately 300 to 550 Å, or 400 Å. When the thickness $t_{202}$ of the first metal oxide layer 202 lies between 300 Å and 550 Å, the light reflectivity can be effectively decreased, although the present invention is not limited thereto.

In an exemplary embodiment, the sidewall of the first metal oxide layer 202 may protrude from the sidewall of the second metal layer 201b to form the tip T2. The tip T2 of the first metal oxide layer 202 disposed above the first wiring layer 200 can serve to decrease the reflectivity. For example, the width $W_{1c}$ of the surface (lower surface in the drawings) of the first metal oxide layer 202 facing the second metal layer 201b may be greater than the width $W_{1d}$ of the surface (upper surface in the drawings) of the second metal layer 201b facing the first metal oxide layer 202. The upper limit of the length L2 of the tip of the first metal oxide layer 202 may be approximately 0.80 μm or less. If the length L2 of the tip is larger than 0.80 μm, it may disturb the subsequent processes after forming the first wiring layer 200. For example, when the length L2 of the tip of the first metal oxide layer 202 is less than 0.80 μm, the density of the first insulating layer 310 can be improved. The lower limit of the length L2 of the tip may be approximately 0.03 μm or more. If the length L2 of the tip of the first metal oxide layer 202 is larger than 0.03 μm, the reflectivity of the first wiring layer 200 can be effectively reduced.

On the other hand, the first metal oxide layer 202 may be disposed at the top of the first wiring layer 200. It is possible to effectively reduce the reflectivity of the first wiring layer 200 by disposing the first metal oxide layer 202 having a large light absorptivity and having a thickness exhibiting destructive interference at the top of the first wiring layer 200. The reflectivity of the first wiring layer 200 with respect to light that has the wavelength of 550 nm and is incident from the first metal oxide layer 202 (from above in the drawings) toward the first wiring layer 200 may be equal to or less than approximately 6.0%, approximately 5.5%, approximately 5.4%, approximately 5.3%, approximately 5.2%, approximately 5.1%, or approximately 5.0%, although the present invention is not limited thereto. Further, the first wiring layer 200 includes the first conductive metal layer 201 so that it can impart excellent electrical conductivity and can work (e.g., function) as a wire as well as an electrode.

As described above, the first wiring layer 200 may include the gate signal wire 210 and the sustaining electrode 230.

In an exemplary embodiment, the gate signal wire 210 extended in the first direction X may completely overlap with the light-shielding member 700 having a line shape and extended in the first direction X. In other words, the gate signal wire 210 may be completely covered by the light-shielding member 700.

In addition, the sustaining electrode 230 may partially overlap with the light-shielding member 700. For example, when the sustaining electrode 230 includes a portion extended in the first direction X and a portion extended in the second direction Y, at least a part of the portion extended in the second direction Y may not be overlapped with the light-shielding member 700 but may be exposed to external light.

The first wiring layer 200 according to the exemplary embodiment of the present disclosure may have a very low reflectivity with respect to light in the visible wavelength band, and thus the area occupied by the light-shielding member 700 can be reduced when viewed from the top. The display device 1 according to the exemplary embodiment of the present disclosure can exhibit good contrast ratio even though the light-shielding member 700 is extended only in the first direction X and does not have the portion extended in the second direction Y, although the present invention is not limited thereto. In addition, it is also possible to eliminate the light-shielding member 700 extended in the second direction Y at the boundary between the pixels PXa and PXb adjacent in the first direction X so as to improve the aperture ratio of the display device 1.

Subsequently, the second wiring layer 500 will be described in more detail. The second wiring layer 500 may include a second conductive metal layer 501 disposed above the first wiring layer 200 such that it is insulated therefrom, and a second metal oxide layer 502 disposed on the second conductive metal layer 501. For example, the first insulating layer 310 may be disposed between the first wiring layer 200 and the second wiring layer 500.

The second conductive metal layer 501 may have a structure in which two or more layers are stacked on one another. For example, the second conductive metal layer 501 may include a third metal layer 501a and a fourth metal layer 501b.

In an exemplary embodiment of the present disclosure, the thickness $t_{501a}$ of the third metal layer 501a of the second wiring layer 500 may be equal to or less than the thickness $t_{201a}$ of the first metal layer 201a of the first wiring layer 200. If the first base 110 is made of a glass material or the like, the adhesion and processability of the first wiring layer 200 can be improved by forming the first metal layer 201a of the first wiring layer 200 so that it has a sufficient thickness $t_{201a}$. In addition, the thickness $t_{501b}$ of the fourth metal layer 501b of the second wiring layer 500 may be equal to or less than the thickness $t_{201b}$ of the second metal layer 201b of the first wiring layer 200. The resistance of the first wiring layer 200 can be reduced and the deterioration and stability can be improved by forming the second metal layer 201b of the first wiring layer 200 that is extended longer so that it has a sufficient thickness $t_{201b}$.

The material, functionality, refractive index, shape and the like of the third metal layer 501a and the fourth metal layer 501b of the second wiring layer 500 may be substantially identical to those of the first metal layer 201a and the second metal layer 201b of the first wiring layer 200, therefore, the redundant description will be omitted.

In addition, the second metal oxide layer 502 may be disposed directly on the fourth metal layer 501b. The second metal oxide layer 502 may include a material having a higher light absorptivity and a lower light reflectivity than the second conductive metal layer 501. In an exemplary embodiment, the second metal oxide layer 502 may include $Mo_xTa_yO_z$. The upper limit of the content of tantalum among the metal atoms in the second metal oxide layer 502 may be approximately 2.0 at % or less. In addition, the lower limit of the content of tantalum among the metal atoms in the second metal oxide layer 502 may be, but is not limited to, approximately 0.3 at % or more.

The sidewall of the second metal oxide layer 502 may protrude from the sidewall of the fourth metal layer 501b to form a tip T3. The tip T3 of the second metal oxide layer 502 disposed above the second wiring layer 500 can serve to decrease the reflectivity. For example, the width $W_{2c}$ of the surface (lower surface in the drawings) of the second metal oxide layer 502 facing the fourth metal layer 501b may be greater than the width $W_{2d}$ of the surface (upper surface in the drawings) of the fourth metal layer 501b facing the second metal oxide layer 502.

In an exemplary embodiment, the length L3 of the tip of the second metal oxide layer 502 of the second wiring layer 500 may be greater than the length L2 of the tip of the first metal oxide layer 202 of the first wiring layer 200. By forming the length L3 of the tip of the second metal oxide layer 502 of the second wiring layer 500 long enough, excellent low reflection change can be achieve. In addition, by forming the length L2 of the tip of the first metal oxide layer 202 of the first wiring layer 200 shorter, the processability of the first insulating layer 310 can be achieved. For example, the upper limit of the length L3 of the tip of the second metal oxide layer 502 of the second wiring layer 500 may be approximately 1.00 μm or less. The lower limit of the length L3 of the tip may be approximately 0.03 μm or more.

The material, functionality, light absorptivity, refractive index, thickness and the like of the second metal oxide layer 502 of the second wiring layer 500 may be substantially identical to the first metal oxide layer 202 of the first wiring layer 200, therefore, the redundant description will be omitted.

On the other hand, the second metal oxide layer 502 may be disposed at the top of the second wiring layer 500. It is possible to effectively reduce the reflectivity of the second wiring layer 500 by disposing the second metal oxide layer 502 having a large light absorptivity and having a thickness exhibiting destructive interference at the top of the second wiring layer 500. The reflectivity of the second wiring layer 500 with respect to light that has the wavelength of 550 nm and is incident from the second metal oxide layer 502 (from above in the drawings) toward the second wiring layer 500 may be equal to or less than approximately 6.0%, approximately 5.5%, approximately 5.4%, approximately 5.3%, approximately 5.2%, approximately 5.1%, or approximately 5.0%, although the present invention is not limited thereto. Further, the second wiring layer 500 includes the second conductive metal layer 501 so that it can impart excellent electrical conductivity and can work as a wire as well as an electrode.

In an exemplary embodiment, an active layer 400 may be disposed between the second wiring layer 500 and the first insulating layer 310. When the second conductive metal layer 501 comes in contact with the active layer 400, the third metal layer 501a may serve as a barrier for preventing (or substantially preventing) ions in the fourth metal layer 501b from diffusing into the active layer 400. In some embodiments, if the active layer 400 is made of amorphous silicon or the like, an ohmic contact layer may be further disposed between the second wiring layer 500 and the active layer 400. The ohmic contact layer may include n+hydrogenated amorphous silicon highly doped with n-type impurities or may include silicide. The ohmic contact layer can reduce the contact resistance between the second wiring layer 500 and the active layer 400.

As described above, the second wiring layer 500 may include the data signal wiring 510, and may further include the reference voltage wiring 570.

In an exemplary embodiment, the data signal wire 510 and the reference voltage wire 570 extended in the second direction Y may partially overlap with the light-shielding member 700. For example, at least a part of the data signal wire 510 and the reference voltage wire 570 may not be overlapped with the light-shielding member 700 but may be exposed to external light.

The second wiring layer 500 according to the exemplary embodiment of the present disclosure may have a very low reflectivity with respect to light in the visible wavelength band, and thus the area occupied by the light-shielding member 700 can be reduced when viewed from the top. The display device 1 according to the exemplary embodiment of the present disclosure can exhibit good contrast ratio even though the light-shielding member 700 is extended only in the first direction X and does not have the portion extended in the second direction Y (e.g., the light-shielding member 700 has a narrow strip shape extending in the first direction X and has a very small width in the second direction Y), although the present invention is not limited thereto. In addition, it is also possible to eliminate the light-shielding member 700 extended in the second direction Y (e.g., there is no light-shielding member 700) at the boundary between the pixels PXa and PXb adjacent in the first direction X so as to improve the aperture ratio of the display device 1.

Hereinafter, a method of fabricating a wire substrate according to exemplary embodiments of the present disclosure will be described in more detail.

FIGS. 6 to 13 are views for illustrating a method of fabricating a wire substrate according to an exemplary embodiment of the present disclosure, which are cross-sectional views with respect to FIG. 4.

Figure 6:
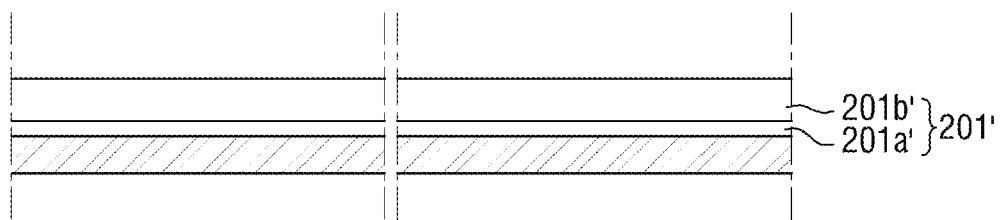
FIGS. 6 to 13 are schematic illustrations showing a method of fabricating a wire substrate according to an exemplary embodiment of the present disclosure.

Referring first to FIG. 6, a first conductive metal layer 201' is formed on a first base 110. In an exemplary embodiment, the first conductive metal layer 201' may have a structure including one or more layers stacked on one another. The first conductive metal layer 201' may include a first metal layer 201a' directly disposed on the first base 110 and a second metal layer 201b' disposed directly on the first metal layer 201a'. The method of forming the first metal layer 201a' and the second metal layer 201b' may include, but is not limited to, a deposition method such as vacuum deposition and sputtering. The first metal layer 201a' and the second metal layer 201b' are substantially the same as the first metal layer 201a and the second metal layer 201b described above, and thus redundant description will be omitted.

Figure 7:
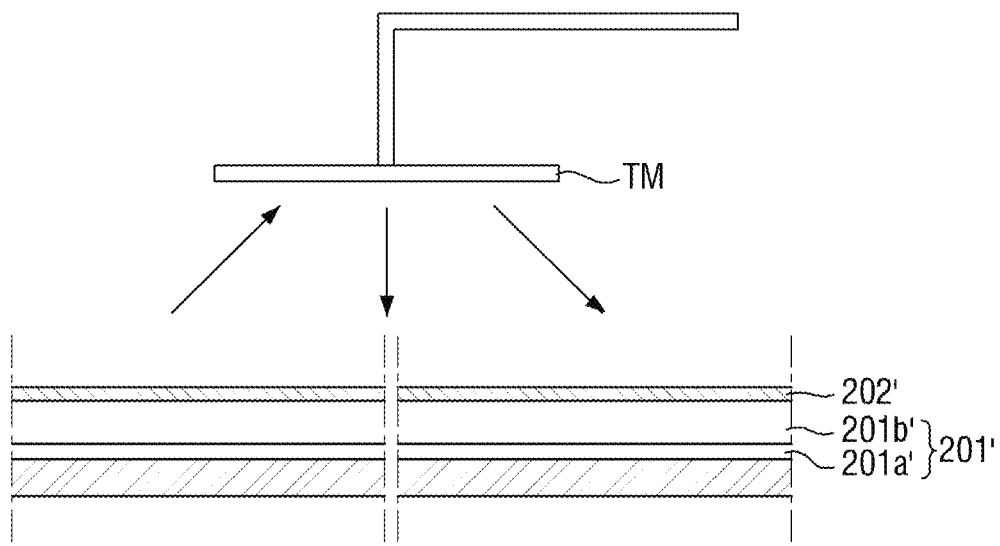

Referring next to FIG. 7, a first metal oxide layer 202' is formed on the first conductive metal layer 201'. The forming of the first metal oxide layer 202' may include depositing the first metal oxide layer 202' directly on the second metal layer 201b' utilizing sputtering. The sputtering process may be DC sputtering utilizing a DC voltage source.

The sputtering process may be carried out under an inert gas atmosphere. For example, the sputtering process may be carried out under an argon atmosphere containing no oxygen. In addition, the target material TM for the sputtering process may include $Mo_xTa_yO_z$. The upper limit of the content of tantalum among the metal atoms in the target material TM may be approximately 2.0 at % or less. The atomic ratio in the first metal oxide layer 202' can be precisely controlled by utilizing the target material TM in the oxide state to form the first metal oxide layer 202'. For example, the composition of the target material TM for the sputtering may be substantially identical to the composition of the first metal oxide layer 202' formed after the sputtering. That is, by performing the sputtering utilizing the target material TM having a desired composition, it is possible to precisely control the composition of the first metal oxide layer 202'.

The thickness $t_{202}$ of the deposited first metal oxide layer 202' may be approximately 100 to 2,000 Å, approximately 300 to 550 Å, or approximately 400 Å. When the thickness $t_{202}$ of the deposited first metal oxide layer 202' lies between 300 Å and 550 Å, the light reflectivity can be decreased effectively, although the present invention is not limited thereto.

Figure 8:
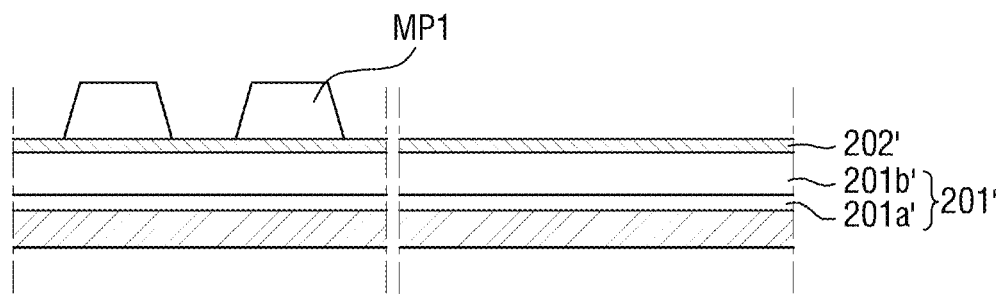

Subsequently, referring to FIG. 8, a first mask pattern MP1 is formed on the first metal oxide layer 202'.

In an exemplary embodiment, the forming of the first mask pattern MP1 may include forming a layer of photosensitive material on the first metal oxide layer 202', partially irradiating light onto the layer of photosensitive material utilizing a mask (e.g., a first mask), and applying a developer to develop the first mask pattern MP1.

The layer of photosensitive material may include a material that is responsive to light. For example, the layer of photosensitive material may include a negative photosensitive material or a positive photosensitive material.

In the exposed portion where light is irradiated via the opening of the mask, polymers are at least partially cured in the negative photosensitive material, such that they become insoluble. Accordingly, the non-exposed portion may be removed by the developer. As a result, the residual photosensitive material pattern may have a shape conforming to the reversed light-shielding pattern of the mask, i.e., a shape confirming to the opening pattern.

In the exposed portion where light is irradiated via the opening of the mask, bondings between polymers (e.g., between polymer molecules) are at least partially disconnected in the positive photosensitive material, such that it becomes soluble. Accordingly, the exposed portion may be removed by the developer. As a result, the residual photosensitive material pattern may have a shape conforming to the light-shielding pattern of the mask.

Figure 9:
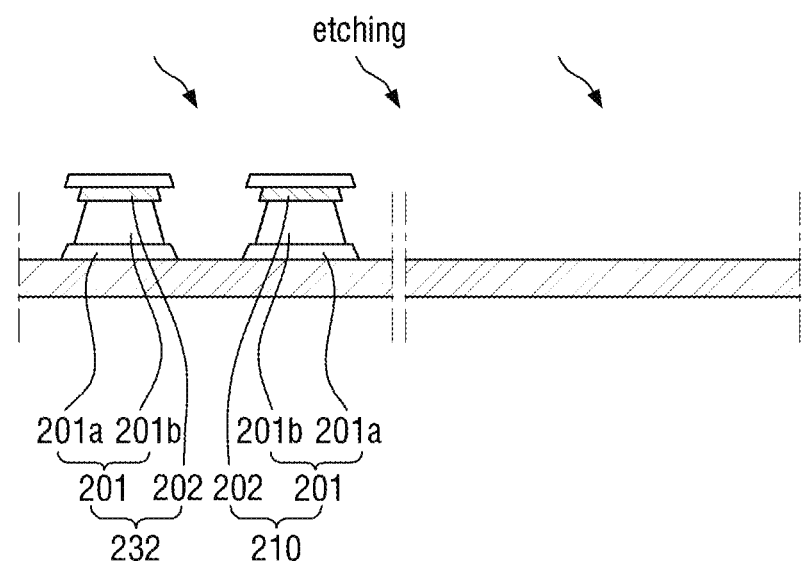

Subsequently, referring to FIG. 9, the first metal layer 201a', the second metal layer 201b' and the first metal oxide layer 202' are etched altogether utilizing the first mask pattern MP1 as an etch mask. In an exemplary embodiment, the etching of the first metal layer 201a', the second metal layer 201b' and the first metal oxide layer 202' may include patterning the first metal layer 201a', the second metal layer 201b' and the first metal oxide layer 202' via a wet etching process to form the first metal layer 201a, the second metal layer 201b and the first metal oxide layer 202.

Wet etching has advantages over dry etching in that it is simpler and has better etching uniformity. For example, the etching of the first metal layer 201a', the second metal layer 201b' and the first metal oxide layer 202' may include applying an etchant.

The etchant may have reactivity to all of the first metal layer 201a', the second metal layer 201b' and the first metal oxide layer 202'. In an exemplary embodiment, the etchant may include peroxysulfate or persulfate of approximately 10.0 to 20.0% by weight (weight percent), an organic acid or salt thereof of approximately 0.1 to 5.0% by weight, a fluorine-containing compound of approximately 0.1 to 1.5% by weight, and a cyclic amine compound of approximately 0.01 to 2.0% by weight, with the rest (i.e., the balance) being water.

The persulfate may be a main component for etching the first metal oxide layer 202' and the second metal layer 201b'. Examples of peroxysulfate may include peroxymonosulfate peroxodisulfate. The peroxysulfate may be in the form of a salt such as ammonium and sodium.

The fluorine-containing compound may be a main component for etching the first metal oxide layer 202' and the first metal layer 201a'. The fluorine-containing compound is not particularly limited as long as it can generate fluorine ions or polyatomic fluorine ions. For example, the fluorine-containing compound may include ammonium fluoride, sodium fluoride, ammonium bifluoride, sodium bifluoride, and potassium bifluoride.

The organic acid or salt thereof and the cyclic amine compound can improve the etching stability of the first metal layer 201a, the second metal layer 201b and the first metal oxide layer 202. Examples of the organic acid include acetic acid and the like, and examples of the cyclic amine compound include an imidazole-based compound and a tetrazole-based compound.

In this manner, the first wiring layer 200 can be formed. The specific shape, arrangement and physical properties of the first wiring layer 200 have been described above, therefore, the redundant description will be omitted.

Figure 10:
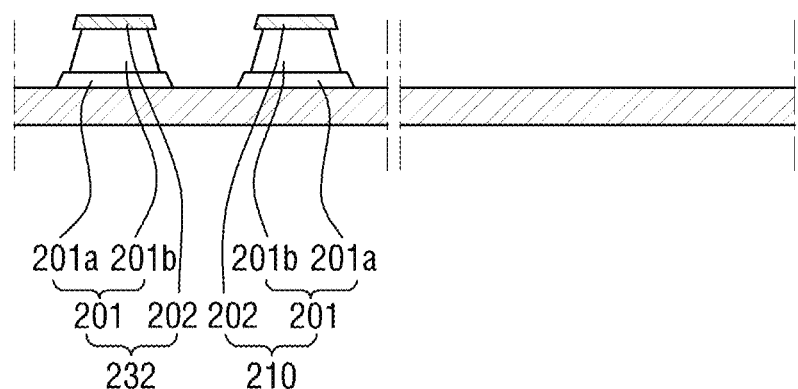
Figure 11:
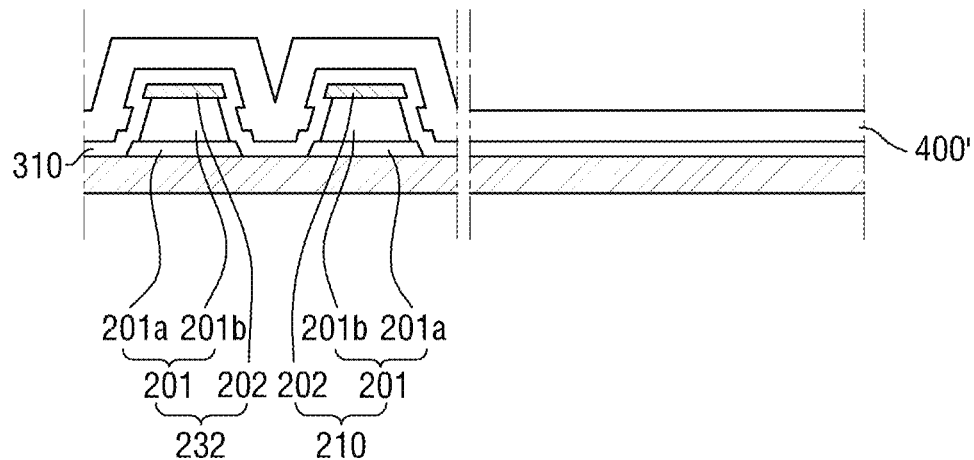

Subsequently, referring to FIGS. 10 and 11, the residual mask pattern is removed. Then, a first insulating layer 310 and an active layer 400' are formed on the first wiring layer 200. In doing so, the active layer 400' may not be patterned yet. The first insulating layer 310 and the active layer 400' (which is substantially the same as the active layer 400) have been described above, therefore, the redundant description will be omitted.

Subsequently, referring to FIG. 12, a second conductive metal layer 501' and a second metal oxide layer 502' are formed on the active layer 400'. In an exemplary embodiment, the second conductive metal layer 501' may have a stack structure in which one or more layers are stacked on one another. The second conductive metal layer 501' may include a third metal layer 501a' disposed directly on the active layer 400' and a fourth metal layer 501b' disposed directly on the third metal layer 501a'. In addition, the second metal oxide layer 502' may be formed by sputtering. The sputtering process has been described above with reference to FIG. 6, therefore, the redundant description will be omitted.

Figure 12:
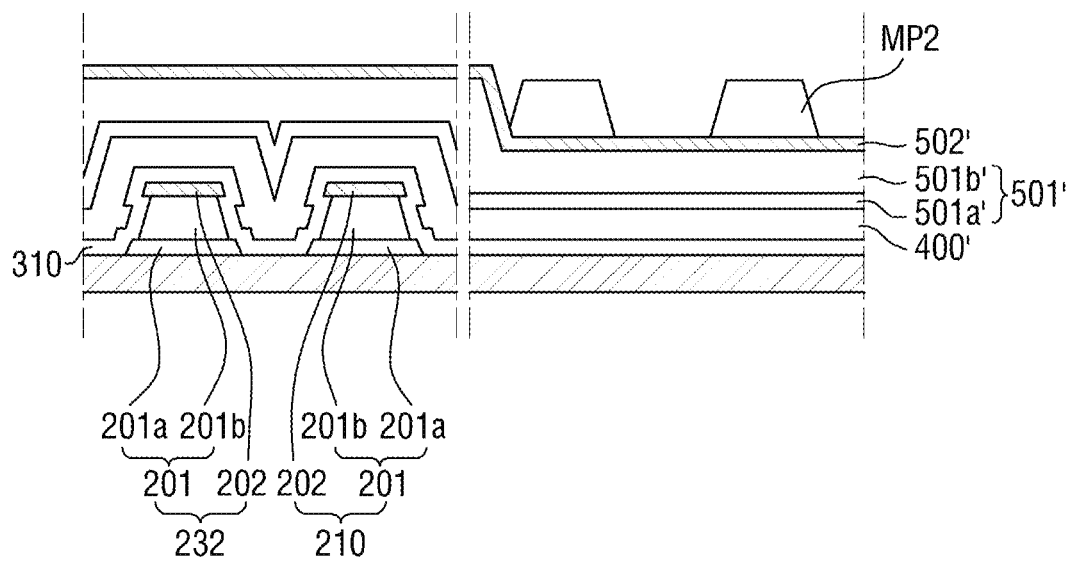

Still referring to FIG. 12, a second mask pattern MP2 is formed on the second metal oxide layer 502'. In an exemplary embodiment, the forming of the second mask pattern MP2 may include forming a layer of photosensitive material on the second metal oxide layer 502', partially irradiating light onto the layer of photosensitive material utilizing a mask (e.g., a second mask), and applying a developer to develop the second mask pattern MP2. In some embodiments, the exposure mask for forming the second mask pattern MP2 may be a halftone mask or a slit mask. The thickness of the second mask pattern MP2 near the channel region of the switching element can be partially controlled by utilizing a halftone mask or the like.

Figure 13:
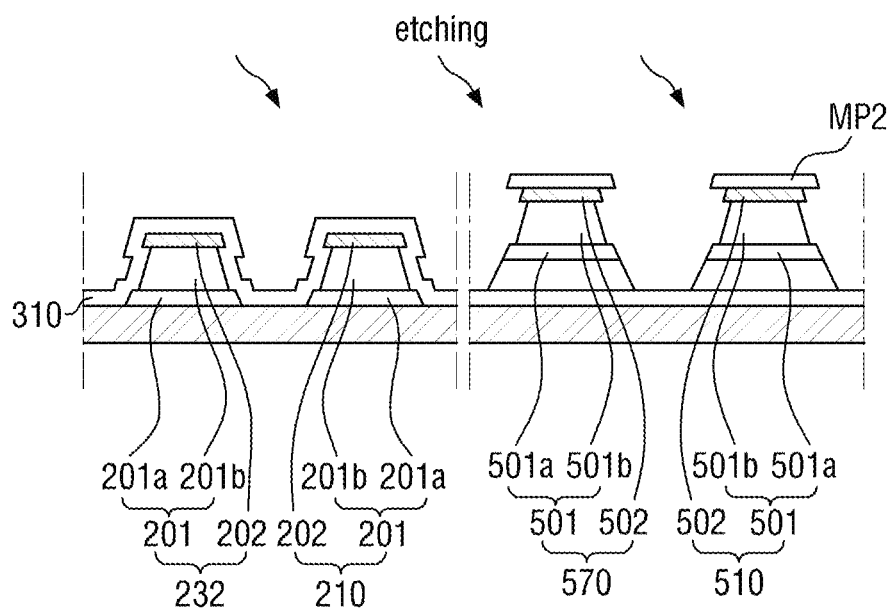

Subsequently, referring to FIG. 13, the active layer 400', the third metal layer 501a', the fourth metal layer 501b' and the second metal oxide layer 502' are etched altogether by utilizing the second mask pattern MP2 as an etching mask. In an exemplary embodiment, the etching the active layer 400', the third metal layer 501a', the fourth metal layer 501b' and the second metal oxide layer 502' may be carried out via a wet etching process to form the active layer 400, the third metal layer 501a, the fourth metal layer 501b and the second metal oxide layer 502 (as shown in FIGS. 1 to 3).

The etchant utilized in the wet etching process may be substantially identical to the etchant utilized in forming the first wiring layer 200.

In this manner, the second wiring layer 500 and the active layer 400 may be formed. The specific shapes, arrangements and physical properties of the second wiring layer 500 and the active layer 400 have been described above, therefore, the redundant description will be omitted.

Although not shown in the drawings, after forming the second wiring layer 500, an insulating layer made of an insulating material, a pixel electrode, and the like may be formed to fabricate a wire substrate for display devices.

Hereinafter, the present disclosure will be described in more detail with reference to specific experimental examples.

Experimental Example 1

Measurement of Reflectivity According to Tantalum Content

A single titanium layer was deposited on a glass substrate at the thickness of approximately 200 Å. Subsequently, a single copper layer was deposited on the titanium layer at the thickness of approximately 6,000 Å. Subsequently, a $Mo_xTa_yO_z$ target material having the content of tantalum of 1.0 at % among the metal atoms was prepared. The target material was deposited to a thickness of about 400 Å on the copper film by sputtering to prepare a triple-layer stack.

Subsequently, a photosensitive mask pattern was formed on the triple-layer stack, and the etchant was applied onto it. The etchant utilized includes peroxysulfate as the main component for etching and further includes an organic acid, a fluorine-containing compound, and a cyclic amine compound. It took 171 seconds until the etching has been completed. Here, the etch time was 171 seconds.

After the etchant was applied, images of the residual stack pattern were captured utilizing a microscope. In addition, the tip length of the $Mo_xTa_yO_z$ layer of the stack pattern and the reflectivity at the top of the stack pattern were measured. The reflectivity was measured in the visible wavelength band.

Experimental Example 2

Measurement of Reflectivity According to Tantalum Content

A triple-layer stack was prepared in substantially the same manner as in Experimental Example 1 except that the content of tantalum in the target material was 2.0 at %. Then, the etchant was applied onto the triple-layer stack. The etch time was 194 seconds.

Subsequently, images were captured by a microscope, and the tip length and reflectivity of the $Mo_xTa_yO_z$ layer were measured.

Experimental Example 3

Measurement of Reflectivity According to Tantalum Content

A triple-layer stack was prepared in substantially the same manner as in Experimental Example 1 except that the content of tantalum in the target material was 4.0 at %. Then, the etchant was applied onto triple-layer stack. The etch time was 295 seconds.

Subsequently, images were captured by a microscope, and the tip length and reflectivity of the $Mo_xTa_yO_z$ layer were measured.

Experimental Example 4

Measurement of Reflectivity According to Tantalum Content

A triple-layer stack was prepared in substantially the same manner as in Experimental Example 1 except that the content of tantalum in the target material was 6.0 at %. Then, the etchant was applied onto triple-layer stack. The etch time was 171 seconds.

Subsequently, images were captured by a microscope, and the tip length and reflectivity of the $Mo_xTa_yO_z$ layer were measured.

FIG. 14 shows microscopic images of the stack patterns formed according to Experimental Examples 1 to 4.

Referring to FIG. 14, it can be seen that the triple-layer stacks including the $Mo_xTa_yO_z$ layer were etched altogether to form patterns. The taper angle of the stack pattern according to Experimental Example 1 was approximately 72 degrees, the taper angle of the stack pattern according to Experimental Example 2 was approximately 69 degrees, the taper angle of the stack pattern according to Experimental Example 3 was approximately 85 degrees, and the taper angle of the stack pattern according to Experimental Example 4 was approximately 80 degrees. In this specification, the term 'taper angle' means an angle of inclination between a bottom surface of a pattern and a side surface of the pattern.

Figure 15:
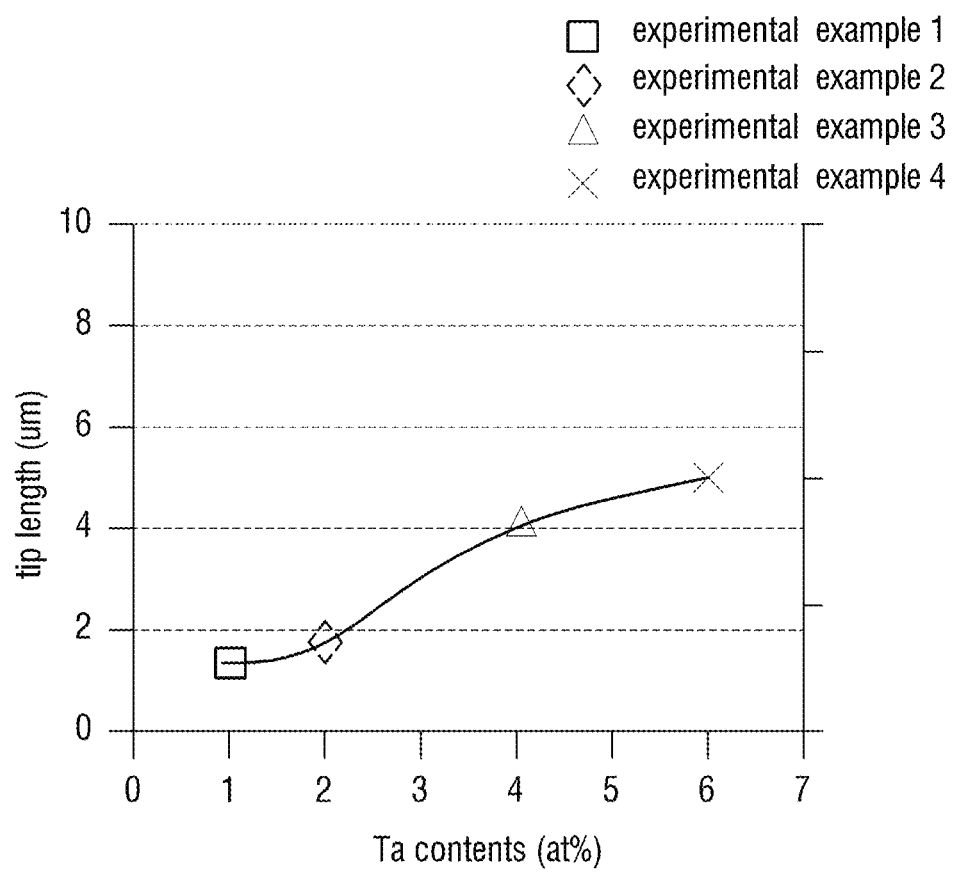
FIG. 15 is a graph showing tip lengths of $Mo_xTa_yO_z$ layers according to Experimental Examples 1 to 4.

FIG. 15 is a graph showing tip lengths of $Mo_xTa_yO_z$ layers according to Experimental Examples 1 to 4.

Specifically, the tip length of the $Mo_xTa_yO_z$ layer of the pattern according to Experimental Example 1 was approximately 0.05 μm, and the tip length of the $Mo_xTa_yO_z$ layer of the pattern according to Experimental Example 2 was approximately 0.07 μm. In addition, the tip length of the $Mo_xTa_yO_z$ layer of the pattern according to Experimental Example 3 was approximately 0.16 μm, and the tip length of the $Mo_xTa_yO_z$ layer of the pattern according to Experimental Example 4 was approximately 0.20 μm. Here, it can be seen that the tip length gradually increases as the tantalum content in the $Mo_xTa_yO_z$ layer increases. In particular, comparing Experimental Example 2 with Experimental Example 3, it can be seen that the length of the tip is increased more than twice as the tantalum content exceeds 2.0 at %, and accordingly it is difficult to control the etched surface (e.g., the shape of the etched surface).

Figure 16:
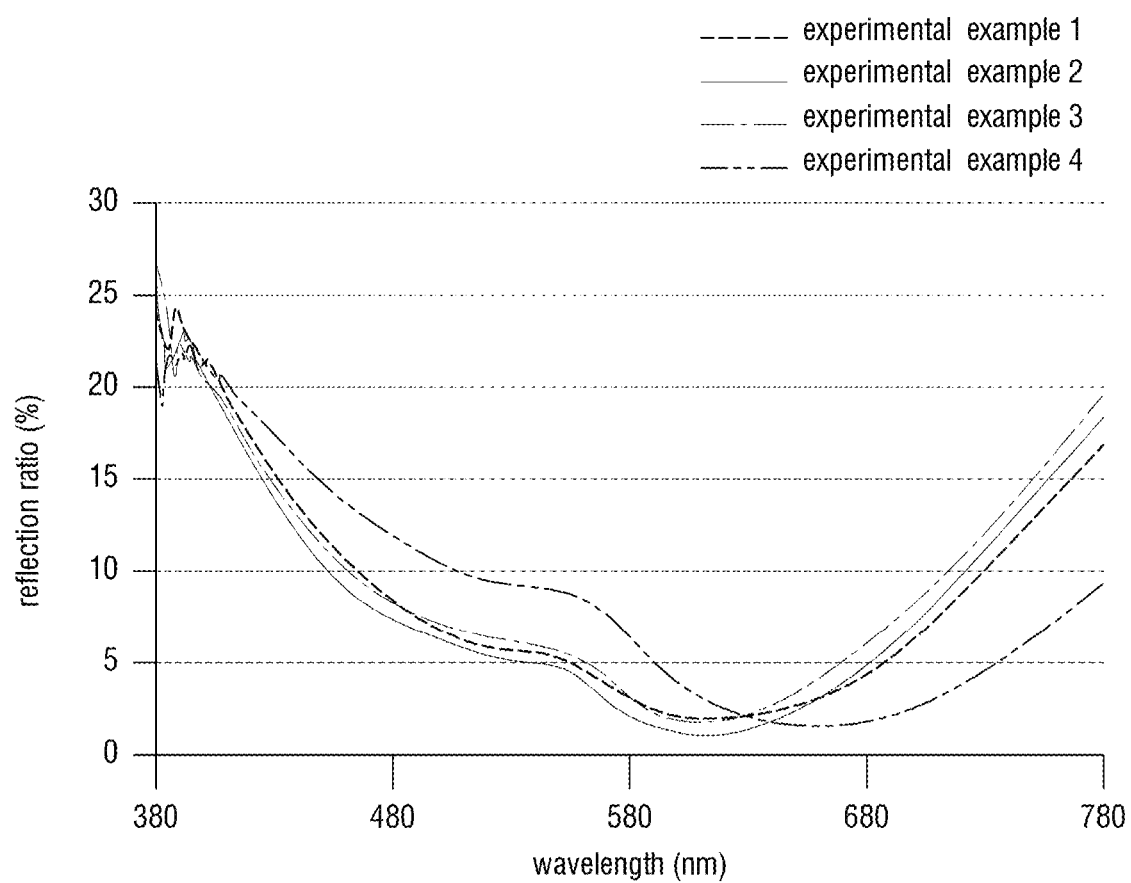
FIG. 16 is a graph showing the light reflectivity of the stack patterns according to Experimental Examples 1 to 4 measured in the visible wavelength band.

FIG. 16 is a graph showing the light reflectivity of the stack patterns according to Experimental Examples 1 to 4 measured in the visible wavelength band.

Referring to FIG. 16, it can be seen that the light reflectivity of the stack pattern according to Experimental Example 2 has the minimum value. That is, it is to be noted that the light reflectivity does not change linearly with increasing or decreasing tantalum content in the $Mo_xTa_yO_z$ layer. It can be seen that the light reflectivity of the stack pattern has the minimum value when the tantalum content in the $Mo_xTa_yO_z$ layer is between 1.0 at % and 2.0 at %.

The average of light reflectivities of the stack patterns according to Experimental Examples 1 to 4, and the light reflectivity with respect to light having the wavelength of 550 nm are shown in Table 1 below:

TABLE 1

| | Light Reflectivity (%) | |
|---|---|---|
| | Average Light Reflectivity (%) | Light Reflectivity at Wavelength of 550 nm |
| Experimental Example 1 | 8.61 | 5.34 |
| Experimental Example 2 | 8.41 | 4.72 |
| Experimental Example 3 | 8.94 | 5.47 |
| Experimental Example 4 | 8.46 | 8.65 |

Experimental Example 5

Comparison of Etching Characteristics According to Etchant Components

A triple-layer stack was prepared in substantially the same manner as in Experimental Example 2 except that an etchant containing sulfuric acid as the main component for etching was utilized. Then, the etchant was applied onto the thriple-layer stack.

Images were captured utilizing a microscope to observe the etched layers.

Experimental Example 6

Comparison of Etching Characteristics According to Etchant Components

A triple-layer stack was prepared in substantially the same manner as in Experimental Example 3 except that an etchant containing sulfuric acid as the main component for etching was utilized. Then, the etchant was applied onto the triple-layer stack.

Images were captured utilizing a microscope to observe the etched layers.

Experimental Example 7

Comparison of Etching Characteristics According to Etchant Components

A triple-layer stack was prepared in substantially the same manner as in Experimental Example 4 except that an etchant containing sulfuric acid as the main component for etching was utilized. Then, the etchant was applied onto the triple-layer stack.

Images were captured utilizing a microscope to observe the etched layers.

Experimental Example 8

Comparison of Etching Characteristics According to Etchant Components

A triple-layer stack was prepared in substantially the same manner as in Experimental Example 2 except that an etchant containing phosphoric acid, nitric acid and acetic acid as the main components for etching was utilized. Then, the etchant was applied onto the triple-layer stack.

Images were captured by utilizing a microscope to observe the etched layers.

Experimental Example 9

Comparison of Etching Characteristics According to Etchant Components

A triple-layer stack was prepared in substantially the same manner as in Experimental Example 3 except that an etchant containing phosphoric acid, nitric acid and acetic acid as the main components for etching was utilized. Then, the etchant was applied onto the triple-layer stack.

Images were captured utilizing a microscope to observe the etched layers.

Experimental Example 10

Comparison of Etching Characteristics According to Etchant Components

A triple-layer stack was prepared in substantially the same manner as in Experimental Example 4 except that an etchant containing phosphoric acid, nitric acid and acetic acid as the main components for etching was utilized. Then, the etchant was applied onto the triple-layer stack.

Images were captured utilizing a microscope to observe the etched layers.

Experimental Example 11

Comparison of Etching Characteristics According to Etchant Components

A triple-layer stack was prepared in substantially the same manner as in Experimental Example 2 except that an etchant containing peroxide as the main component for etching was utilized. Then, the etchant was applied onto the triple-layer stack.

Images were captured utilizing a microscope to observe the etched layers.

Experimental Example 12

Comparison of Etching Characteristics According to Etchant Components

A triple-layer stack was prepared in substantially the same manner as in Experimental Example 3 except that an etchant containing peroxide as the main component for etching was utilized. Then, the etchant was applied onto the triple-layer stack.

Images were captured utilizing a microscope to observe the etched layers.

Experimental Example 13

Comparison of Etching Characteristics According to Etchant Components

A triple-layer stack was prepared in substantially the same manner as in Experimental Example 4 except that an etchant containing peroxide as the main component for etching was utilized. Then, the etchant was applied onto the triple-layer stack.

Images were captured m utilizing a microscope to observe the etched layers.

Figure 17A:
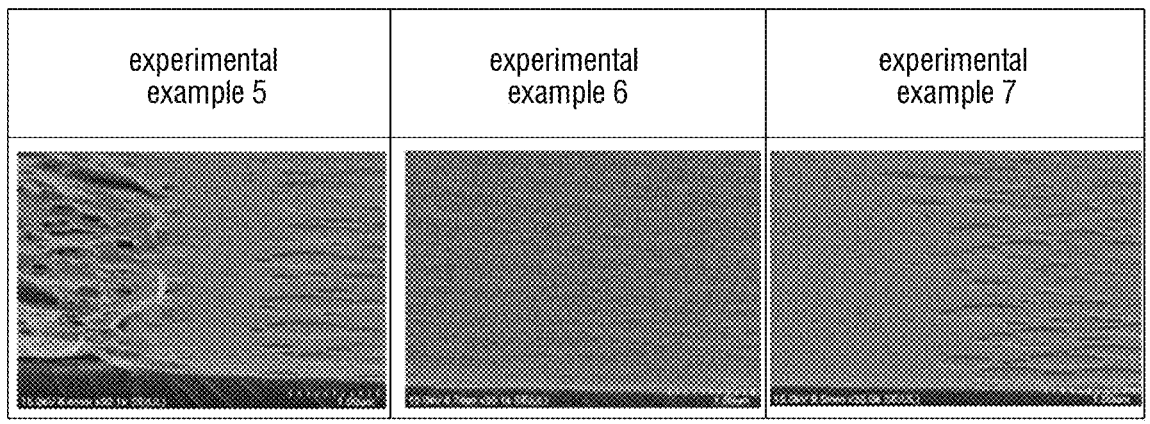
FIGS. 17A to 17C show microscopic images according to Experimental Examples 5 to 13.
Figure 17B:
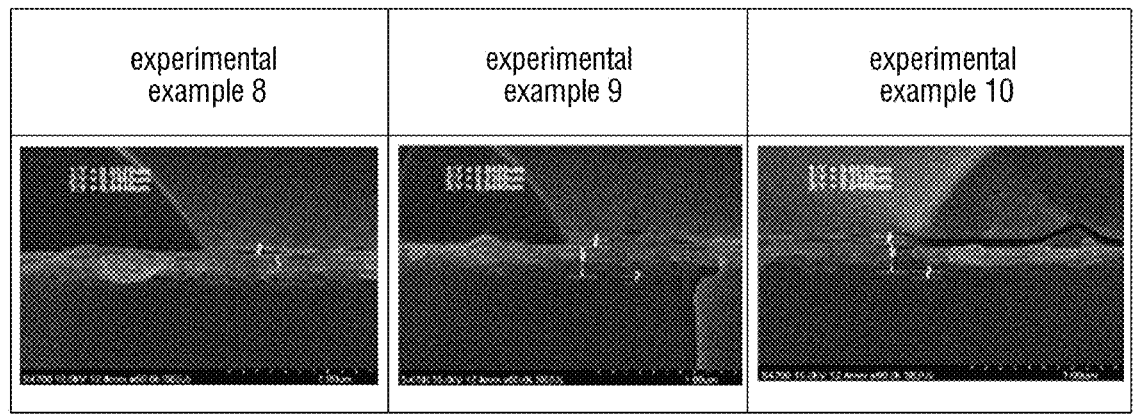
Figure 17C:
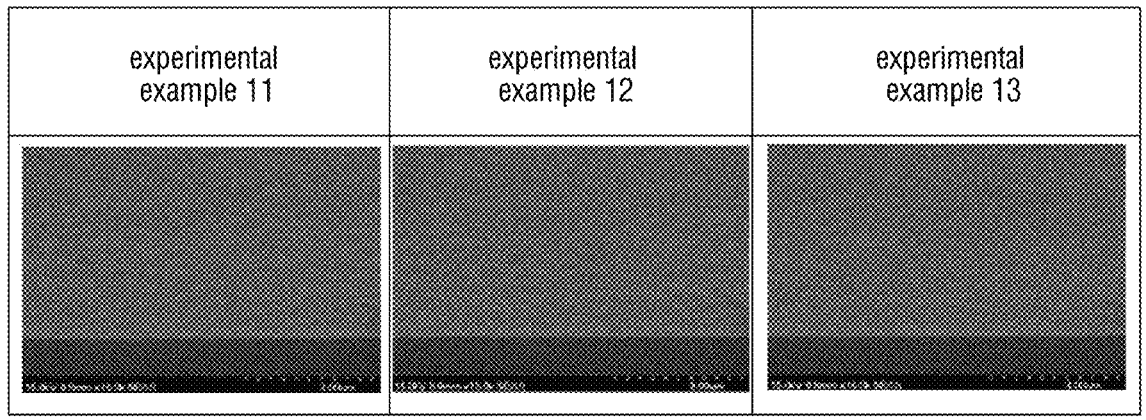

FIG. 17A shows microscopic images according to Experimental Examples 5 to 7. FIG. 17B shows microscopic images according to Experimental Examples 8 to 10. FIG. 17C shows microscopic images according to Experimental Examples 11 to 13.

Referring to FIG. 17A, it can be seen that the triple-layer stacks were overly etched and could not form a pattern when the etchant containing sulfuric acid as the main component for etching was utilized. Referring to FIG. 17B, it can be seen that the layers were unetched when the etchant containing phosphoric acid, nitric acid and acetic acid as the main components for etching was utilized. Referring to FIG. 17C, it can be seen that the triple-layer stacks were overly etched and could not form a pattern when the etchant containing peroxide as the main component for etching was utilized.

Therefore, it can be seen that the etchant containing the peroxysulfate utilized in Experimental Examples 1 to 4 exhibited excellent etching properties over the other etchants with respect to the triple-layer stack including the $Mo_xTa_yO_z$ layer.

Experimental Example 14

A simulation was carried out to see light reflectivity according to the thickness of the $Mo_xTa_yO_z$ layer having the content of tantalum of 2.0 at % when the thickness of the titanium layer was 200 Å and the thickness of the copper layer was 6,000 Å. The thickness of the $Mo_xTa_yO_z$ layer was measured at every 50 Å from 50 Å to 1200 Å. Light reflectivity was measured in the visible wavelength band.

Figure 18:
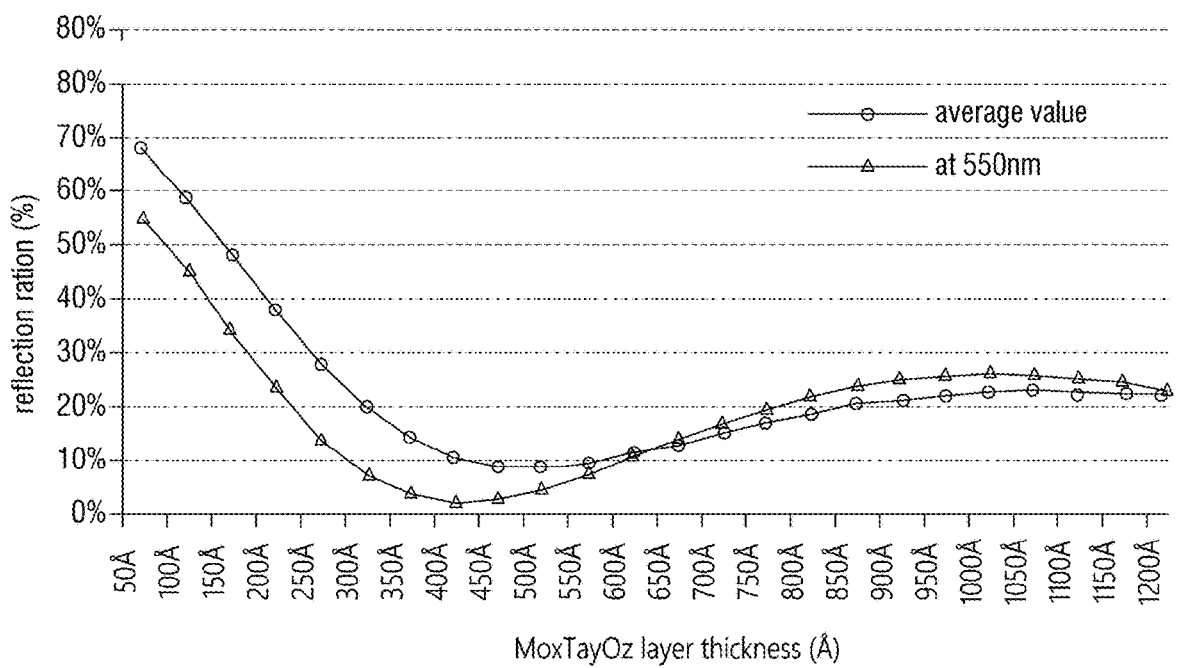
FIG. 18 is a graph showing simulation results according to Experimental Example 14.

FIG. 18 is a graph showing simulation results according to Experimental Example 14.

Referring to FIG. 18, it can be seen that the light reflectivity of the triple-layer stack pattern varies depending on the thickness of the $Mo_xTa_yO_z$ layer.

Specifically, when the thickness of the $Mo_xTa_yO_z$ layer was 50 Å, the reflectivity with respect to light having the wavelength of 550 nm was approximately 55.1%. In addition, when the thickness of the $Mo_xTa_yO_z$ layer was 250 Å, the reflectivity with respect to light having the wavelength of 550 nm was approximately 14.0%. On the other hand, when the thickness of the $Mo_xTa_yO_z$ layer was 300 Å, the reflectivity with respect to light having the wavelength of 550 nm was approximately 7.2%, which is significantly lowered. Further, when the thickness of the $Mo_xTa_yO_z$ layer was 400 Å, the reflectivity with respect to light having the wavelength of 550 nm was approximately 1.8%, which is the lowest.

In addition, when the thickness of the $Mo_xTa_yO_z$ layer is 550 Å, the reflectivity with respect to light having the wavelength of 550 nm was approximately 7.5%. On the other hand, as the thickness of the $Mo_xTa_yO_z$ layer is increased to 600 Å, the reflectivity with respect to light having the wavelength of 550 nm was increased (e.g., abruptly increased) to approximately 10.7%. When the thickness of the $Mo_xTa_yO_z$ layer is 750 Å or more, the reflectivity with respect to light having the wavelength of 550 nm converged to approximately 20%.

While the present invention has been particularly illustrated and described with reference to exemplary embodiments thereof, it will be understood by those of ordinary skill in the art that various suitable changes in form and detail may be made therein without departing from the spirit and scope of the present invention as defined by the following claims, and equivalents thereof. The exemplary embodiments should be considered in a descriptive sense only and not for purposes of limitation.

What is claimed is:

1. A display device comprising:
   a first base; and
   a first wiring layer on the first base, the first wiring layer comprising a conductive layer and a metal oxide layer on the conductive layer,
   wherein the metal oxide layer comprises molybdenum (Mo), tantalum (Ta), and oxygen (O),
   wherein the conductive layer comprises a first metal layer on the first base, and a second metal layer between the first metal layer and the metal oxide layer,
   wherein the second metal layer has a higher electrical conductivity than the first metal layer, and
   wherein a thickness of the second metal layer is greater than a thickness of the first metal layer.

2. The display device of claim 1, wherein the conductive layer is opaque, and
   wherein a light reflectivity of the metal oxide layer is less than a light reflectivity of a top layer of the conductive layer in contact with the metal oxide layer.

3. The display device of claim 1, wherein the conductive layer is between the first base and the metal oxide layer, and
   wherein the metal oxide layer is a top layer of the first wiring layer.

4. The display device of claim 1, wherein the conductive layer is between the first base and the metal oxide layer, and
   wherein a reflectivity of the first wiring layer with respect to light that has a wavelength of 550 nm and is incident in a direction from an upper side to a lower side is equal to or less than 6.0%.

5. The display device of claim 1, wherein the first metal layer comprises a refractory metal, and
   wherein the second metal layer comprises copper, silver, aluminum, or an alloy thereof.

6. The display device of claim 1, wherein the second metal layer is in contact with the first metal layer and the metal oxide layer,
   wherein a thickness of the metal oxide layer is greater than the thickness of the first metal layer and is less than the thickness of the second metal layer, and
   wherein the thickness of the metal oxide layer ranges from 300 to 550 Å.

7. The display device of claim 1, wherein the second metal layer is in contact with the first metal layer, and
   wherein a width of a surface of the first metal layer facing the second metal layer is greater than a width of a surface of the second metal layer facing the first metal layer.

8. The display device of claim 1, wherein a side wall of the metal oxide layer protrudes from a side wall of the conductive layer to form a tip.

9. The display device of claim 1, further comprising: a second wiring layer partially overlapping with the first wiring layer and insulated from the first wiring layer, the second wiring layer comprising a conductive layer and a metal oxide layer stacked on one another,
   wherein the metal oxide layer of the second wiring layer comprises MoxTayOz, wherein a content of tantalum is equal to or less than 2.0 at % based on a total number of metal atoms.

10. The display device of claim 9, further comprising:
    a semiconductor material layer between the first and second wiring layers,
    wherein the first base comprises a glass substrate, and
    wherein the conductive layer of the first wiring layer is directly on the first base.

11. The display device of claim 9, wherein the first wiring layer comprises a gate signal wire extending in a first direction and a sustaining electrode, and
    wherein the second wiring layer comprises a data signal wire extending in a second direction crossing the first direction.

12. The display device of claim 11, wherein the conductive layer of the second wiring layer comprises a third metal layer, and a fourth metal layer between the third metal layer and the metal oxide layer,
    wherein the thickness of the first metal layer is greater than a thickness of the third metal layer, and
    wherein the thickness of the second metal layer is greater than a thickness of the fourth metal layer.

13. The display device of claim 11, wherein a side wall of the metal oxide layer protrudes from a side wall of the conductive layer to form a tip in each of the first wiring layer and the second wiring layer, and
    wherein a length of the tip of the metal oxide layer in the second wiring layer is greater than a length of the tip of the metal oxide layer in the first wiring layer.

14. The display device of claim 11, further comprising:
    a light-shielding member on the second wiring layer and having a line shape extended in the first direction, wherein the sustaining electrode comprises a portion extended in the first direction and a portion extended in the second direction, wherein the gate signal wire completely overlaps with the light-shielding member, wherein the sustaining electrode partially overlaps with the light-shielding member, wherein at least a part of the portion extended in the second direction does not overlap the light-shielding member, and wherein the data signal wire partially overlaps with the light-shielding member, wherein at least a part of the data signal wire does not overlap with the light-shielding member.

* * * * *